United States Patent
Rajan et al.

(10) Patent No.: US 7,386,656 B2
(45) Date of Patent: **\*Jun. 10, 2008**

(54) INTERFACE CIRCUIT SYSTEM AND METHOD FOR PERFORMING POWER MANAGEMENT OPERATIONS IN CONJUNCTION WITH ONLY A PORTION OF A MEMORY CIRCUIT

(75) Inventors: Suresh Natarajan Rajan, San Jose, CA (US); Keith R. Schakel, San Jose, CA (US); Michael John Sebastian Smith, Palo Alto, CA (US); David T. Wang, San Jose, CA (US); Frederick Daniel Weber, San Jose, CA (US)

(73) Assignee: MetaRAM, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/524,812

(22) Filed: Sep. 20, 2006

(65) Prior Publication Data
US 2008/0025125 A1    Jan. 31, 2008

Related U.S. Application Data

(63) Continuation-in-part of application No. 11/461,439, filed on Jul. 31, 2006.

(51) Int. Cl.
*G06F 12/00* (2006.01)
(52) U.S. Cl. ........................ 711/103; 711/110
(58) Field of Classification Search ................. 711/103, 711/110, 105, 106, 118; 713/500; 365/226
See application file for complete search history.

(56) References Cited

U.S. PATENT DOCUMENTS

| | | | |
|---|---|---|---|
| 4,525,921 A | 7/1985 | Carson et al. | ............... 29/577 |
| 4,646,128 A | 2/1987 | Carson et al. | ............... 357/74 |
| 4,698,748 A | 10/1987 | Juzswik | ...................... 364/200 |
| 4,706,166 A | 11/1987 | Go | ............................. 361/403 |
| 4,710,903 A | 12/1987 | Hereth | ........................ 365/194 |
| 4,764,846 A | 8/1988 | Go | ............................. 361/388 |
| 4,780,843 A | 10/1988 | Tietjen | ........................ 364/900 |
| 4,841,440 A | 6/1989 | Yonezu | ...................... 364/200 |
| 4,884,237 A | 11/1989 | Mueller et al. | ............... 365/63 |
| 4,982,265 A | 1/1991 | Watanabe et al. | ............. 357/75 |
| 4,983,533 A | 1/1991 | Go | ................................ 437/7 |
| 5,083,266 A | 1/1992 | Watanabe | .................... 395/275 |
| 5,104,820 A | 4/1992 | Go et al. | ....................... 437/51 |
| 5,220,672 A | 6/1993 | Nakao | ......................... 395/750 |
| 5,347,428 A | 9/1994 | Carson et al. | ............... 361/760 |
| 5,388,265 A | 2/1995 | Volk | ............................ 395/750 |
| 5,432,729 A | 7/1995 | Carson et al. | ................ 365/63 |

(Continued)

OTHER PUBLICATIONS

Kellerbauer, "Die schnelle Million," magazin für computer technik, 1991, http://ct.coremelt.net/html/91/12/276/art.htm.

*Primary Examiner*—Vu A Le
(74) *Attorney, Agent, or Firm*—Zilka-Kotab, PC

(57) ABSTRACT

A memory circuit power management system and method are provided. An interface circuit is in communication with a plurality of memory circuits and a system. In use, the interface circuit is operable to perform a power management operation in association with only a portion of the memory circuits

19 Claims, 17 Drawing Sheets

U.S. PATENT DOCUMENTS

| | | | | |
|---|---|---|---|---|
| 5,448,511 | A | 9/1995 | Paurus et al. | 365/52 |
| 5,502,667 | A | 3/1996 | Bertin et al. | 365/51 |
| 5,561,622 | A | 10/1996 | Bertin et al. | 365/51 |
| 5,563,086 | A | 10/1996 | Bertin et al. | 437/52 |
| 5,581,498 | A | 12/1996 | Ludwig et al. | 365/63 |
| 5,590,071 | A | 12/1996 | Kolor et al. | 365/149 |
| 5,680,342 | A | 10/1997 | Frankeny | 365/52 |
| 5,692,202 | A | 11/1997 | Kardach | 395/750 |
| 5,702,984 | A | 12/1997 | Bertin et al. | 437/208 |
| 5,748,914 | A | 5/1998 | Barth | 395/285 |
| 5,752,045 | A | 5/1998 | Chen | 395/750 |
| 5,835,435 | A | 11/1998 | Bogin | 365/227 |
| 5,843,807 | A | 12/1998 | Burns | 438/109 |
| 5,845,108 | A | 12/1998 | Yoo | 395/551 |
| 5,860,106 | A | 1/1999 | Domen | 711/137 |
| 5,884,088 | A | 3/1999 | Kardach | |
| 5,901,105 | A | 5/1999 | Ong | |
| 5,905,688 | A | 5/1999 | Park | 365/227 |
| 5,926,435 | A | 7/1999 | Park | 365/233 |
| 5,943,254 | A | 8/1999 | Bakeman, Jr. et al. | 365/72 |
| 5,953,215 | A | 9/1999 | Karabatsos | 361/767 |
| 5,956,233 | A | 9/1999 | Yew et al. | 361/760 |
| 5,963,464 | A | 10/1999 | Dell et al. | 365/52 |
| 5,973,392 | A | 10/1999 | Senba et al. | 257/686 |
| 6,014,339 | A | 1/2000 | Kobayashi | 365/233 |
| 6,038,673 | A | 3/2000 | Benn | 713/323 |
| 6,070,217 | A | 5/2000 | Connolly et al. | 710/131 |
| 6,073,223 | A | 6/2000 | McAllister | 711/167 |
| 6,075,730 | A | 6/2000 | Barth | 365/191 |
| 6,079,025 | A | 6/2000 | Fung | 713/323 |
| 6,088,290 | A | 7/2000 | Ohtake | 365/233 |
| RE36,839 | E | 8/2000 | Simmons | 326/93 |
| 6,154,370 | A | 11/2000 | Degani et al. | 361/761 |
| 6,166,991 | A | 12/2000 | Phelan | 365/233 |
| 6,222,739 | B1 | 4/2001 | Bhakta et al. | 361/790 |
| 6,233,192 | B1 | 5/2001 | Tanaka | 365/222 |
| 6,240,048 | B1 | 5/2001 | Matsubara | 365/233 |
| 6,252,807 | B1 | 6/2001 | Suzuki | 365/193 |
| 6,298,426 | B1 | 10/2001 | Ajanovic | 711/172 |
| 6,327,664 | B1 | 12/2001 | Dell | 713/323 |
| 6,338,113 | B1 | 1/2002 | Kubo et al. | 711/105 |
| 6,353,561 | B1 | 3/2002 | Funyu | 365/195 |
| 6,356,500 | B1 | 3/2002 | Cloud | 365/226 |
| 6,363,031 | B2 | 3/2002 | Phelan | 365/233 |
| 6,392,304 | B1 | 5/2002 | Butler | 257/777 |
| 6,418,034 | B1 | 7/2002 | Weber et al. | 361/790 |
| 6,442,698 | B2 | 8/2002 | Nizar | 713/320 |
| 6,452,826 | B1 | 9/2002 | Kim et al. | 365/51 |
| 6,453,400 | B1 | 9/2002 | Maesako | 711/167 |
| 6,457,095 | B1 | 9/2002 | Volk | 711/105 |
| 6,487,102 | B1 | 11/2002 | Halbert et al. | 365/51 |
| 6,496,440 | B2 | 12/2002 | Manning | |
| 6,526,471 | B1 | 2/2003 | Shimomura | 711/5 |
| 6,545,895 | B1 | 4/2003 | Li et al. | 365/52 |
| 6,553,450 | B1 | 4/2003 | Dodd et al. | 711/105 |
| 6,574,150 | B2 | 6/2003 | Suyama | |
| 6,587,912 | B2 | 7/2003 | Leddige et al. | 711/5 |
| 6,594,770 | B1 | 7/2003 | Sato | 713/320 |
| 6,597,617 | B2 | 7/2003 | Ooishi | 365/222 |
| 6,618,791 | B1 | 9/2003 | Dodd | 711/105 |
| 6,639,820 | B1 | 10/2003 | Khandekar et al. | 365/63 |
| 6,646,939 | B2 | 11/2003 | Kwak | 365/219 |
| 6,657,634 | B1 | 12/2003 | Sinclair | 345/534 |
| 6,658,530 | B1 | 12/2003 | Robertson | 711/115 |
| 6,665,227 | B2 | 12/2003 | Fetzer | 365/229 |
| 6,683,372 | B1 | 1/2004 | Wong et al. | 257/686 |
| 6,705,877 | B1 | 3/2004 | Li et al. | 439/74 |
| 6,724,684 | B2 | 4/2004 | Kim | 365/233 |
| 6,744,687 | B2 | 6/2004 | Koo | 365/226 |
| 6,747,887 | B2 | 6/2004 | Halbert et al. | 365/51 |
| 6,751,113 | B2 | 6/2004 | Bhakta et al. | 365/63 |
| 6,757,751 | B1 | 6/2004 | Gene | 710/36 |
| 6,765,812 | B2 | 7/2004 | Anderson | 365/51 |
| 6,771,526 | B2 | 8/2004 | LaBerge | 365/63 |
| 6,772,359 | B2 | 8/2004 | Kwak | 713/500 |
| 6,799,241 | B2 | 9/2004 | Kahn et al. | 711/105 |
| 6,816,991 | B2 | 11/2004 | Sanghani | 714/733 |
| 6,820,163 | B1 | 11/2004 | McCall | 710/310 |
| 6,820,169 | B2 | 11/2004 | Wilcox | 711/105 |
| 6,845,055 | B1 | 1/2005 | Koga | 365/229 |
| 6,847,582 | B2 | 1/2005 | Pan | 365/233 |
| 6,862,202 | B2 | 3/2005 | Schaefer | 365/52 |
| 6,873,534 | B2 | 3/2005 | Bhakta et al. | 365/63 |
| 6,894,933 | B2 | 5/2005 | Kuzmenka et al. | 365/189.05 |
| 6,898,683 | B2 | 5/2005 | Nakamura | 711/167 |
| 6,930,900 | B2 | 8/2005 | Bhakta et al. | 365/51 |
| 6,930,903 | B2 | 8/2005 | Bhakta et al. | 365/63 |
| 6,938,119 | B2 | 8/2005 | Kohn et al. | 711/105 |
| 6,961,281 | B2 | 11/2005 | Wong et al. | 365/230 |
| 6,968,416 | B2 | 11/2005 | Moy | 710/310 |
| 6,968,419 | B1 | 11/2005 | Holman | 711/5 |
| 6,970,968 | B1 | 11/2005 | Holman | 711/5 |
| 6,986,118 | B2 | 1/2006 | Dickman | 716/8 |
| 6,992,501 | B2 | 1/2006 | Rapport | 326/30 |
| 7,000,062 | B2 | 2/2006 | Perego et al. | 711/5 |
| 7,003,618 | B2 | 2/2006 | Perego et al. | 711/5 |
| 7,003,639 | B2 | 2/2006 | Tsern | 711/154 |
| 7,007,175 | B2 | 2/2006 | Chang | 713/300 |
| 7,010,642 | B2 | 3/2006 | Perego et al. | 711/5 |
| 7,033,861 | B1 | 4/2006 | Partridge et al. | 438/109 |
| 7,035,150 | B2 | 4/2006 | Streif | 365/194 |
| 7,046,538 | B2 | 5/2006 | Kinsley et al. | 365/52 |
| 7,061,784 | B2 | 6/2006 | Jakobs | 365/51 |
| 7,061,823 | B2 | 6/2006 | Faue | |
| 7,079,441 | B1 | 7/2006 | Partsch | 365/226 |
| 7,085,941 | B2 | 8/2006 | Li | 713/300 |
| 7,089,438 | B2 | 8/2006 | Raad | 713/322 |
| 7,103,730 | B2 | 9/2006 | Saxena | 711/156 |
| 7,245,541 | B2 * | 7/2007 | Janzen | 365/198 |
| 2001/0021106 | A1 | 9/2001 | Weber et al. | 361/790 |
| 2001/0021137 | A1 | 9/2001 | Kai | 365/222 |
| 2002/0019961 | A1 | 2/2002 | Blodgett | 714/718 |
| 2002/0034068 | A1 | 3/2002 | Weber et al. | 361/790 |
| 2002/0038405 | A1 | 3/2002 | Leddige et al. | 711/115 |
| 2002/0041507 | A1 | 4/2002 | Woo | 365/51 |
| 2002/0064073 | A1 | 5/2002 | Chien | 365/200 |
| 2002/0089831 | A1 | 7/2002 | Forthun | 361/760 |
| 2002/0124195 | A1 | 9/2002 | Nizar | 713/320 |
| 2002/0145900 | A1 | 10/2002 | Schaefer | 365/52 |
| 2002/0174274 | A1 | 11/2002 | Wu et al. | 710/100 |
| 2002/0184438 | A1 | 12/2002 | Usui | 711/106 |
| 2003/0021175 | A1 | 1/2003 | Tae Kwak | 365/219 |
| 2003/0035312 | A1 | 2/2003 | Halbert et al. | 365/51 |
| 2003/0039158 | A1 | 2/2003 | Horiguchi et al. | 365/200 |
| 2003/0061458 | A1 | 3/2003 | Wilcox et al. | 711/167 |
| 2003/0093614 | A1 | 5/2003 | Kohn | 711/105 |
| 2003/0105932 | A1 | 6/2003 | David et al. | 711/167 |
| 2003/0117875 | A1 | 6/2003 | Lee et al. | 365/226 |
| 2003/0158995 | A1 | 8/2003 | Lee | 711/105 |
| 2003/0189870 | A1 | 10/2003 | Wilcox | 365/233 |
| 2003/0191888 | A1 | 10/2003 | Klein | 711/105 |
| 2003/0191915 | A1 | 10/2003 | Saxena | 711/160 |
| 2003/0200474 | A1 | 10/2003 | Li | 713/320 |
| 2003/0206476 | A1 | 11/2003 | Joo | 365/222 |
| 2003/0217303 | A1 | 11/2003 | Chua-Eoan et al. | 713/600 |
| 2003/0227798 | A1 | 12/2003 | Pax | |
| 2003/0229821 | A1 | 12/2003 | Ma | 714/8 |
| 2003/0231540 | A1 | 12/2003 | Lazar et al. | 365/222 |
| 2003/0231542 | A1 | 12/2003 | Zaharinova-Papazova | 365/226 |
| 2004/0027902 | A1 | 2/2004 | Ooichi | 365/222 |
| 2004/0034732 | A1 | 2/2004 | Valin et al. | 714/4 |
| 2004/0047228 | A1 | 3/2004 | Chen | 365/232 |
| 2004/0057317 | A1 * | 3/2004 | Schaefer | 365/222 |
| 2004/0088475 | A1 | 5/2004 | Streif | 711/105 |

| | | | | | | |
|---|---|---|---|---|---|---|
| 2004/0117723 A1 | 6/2004 | Foss ............ 714/805 | | 2005/0223179 A1 | 10/2005 | Perego et al. ............ 711/154 |
| 2004/0125635 A1 | 7/2004 | Kuzmenka ............ 365/51 | | 2005/0224948 A1 | 10/2005 | Lee et al. ............ 257/686 |
| 2004/0133736 A1 | 7/2004 | Kyung ............ 711/105 | | 2005/0235131 A1 | 10/2005 | Ware ............ 711/203 |
| 2004/0139359 A1 | 7/2004 | Samson et al. ............ 713/320 | | 2005/0249011 A1 | 11/2005 | Maeda ............ 365/222 |
| 2004/0145963 A1 | 7/2004 | Byon ............ 365/233 | | 2005/0278474 A1 | 12/2005 | Perersen ............ 711/5 |
| 2004/0151038 A1 | 8/2004 | Ruckerbauer et al. ...... 365/200 | | 2005/0281123 A1 | 12/2005 | Bell |
| 2004/0178824 A1 | 9/2004 | Pan ............ 326/93 | | 2005/0283572 A1 | 12/2005 | Ishihara ............ 711/118 |
| 2004/0184324 A1 | 9/2004 | Pax ............ 365/189 | | 2005/0289292 A1 | 12/2005 | Morrow et al. ............ 711/105 |
| 2004/0186956 A1 | 9/2004 | Perego et al. ............ 711/115 | | 2006/0010339 A1 | 1/2006 | Klein ............ 714/5 |
| 2004/0188704 A1 | 9/2004 | Halbert ............ 257/145 | | 2006/0039205 A1* | 2/2006 | Cornelius ............ 365/189.05 |
| 2004/0196732 A1 | 10/2004 | Lee ............ 365/233 | | 2006/0041711 A1 | 2/2006 | Miura ............ 711/103 |
| 2004/0228166 A1 | 11/2004 | Braun et al. ............ 365/154 | | 2006/0041730 A1 | 2/2006 | Larson ............ 711/167 |
| 2004/0228203 A1 | 11/2004 | Koo ............ 365/233 | | 2006/0044913 A1 | 3/2006 | Klein et al. ............ 365/222 |
| 2004/0230932 A1 | 11/2004 | Dickmann ............ 716/10 | | 2006/0050574 A1 | 3/2006 | Streif ............ 365/194 |
| 2004/0256638 A1 | 12/2004 | Perego et al. ............ 257/200 | | 2006/0067141 A1 | 3/2006 | Perego et al. ............ 365/200 |
| 2004/0257847 A1 | 12/2004 | Matsui et al. ............ 365/63 | | 2006/0085616 A1 | 4/2006 | Zeighami et al. ............ 711/167 |
| 2004/0260957 A1 | 12/2004 | Jeddeloh ............ 713/300 | | 2006/0090054 A1 | 4/2006 | Choi et al. ............ 711/167 |
| 2005/0018495 A1 | 1/2005 | Bhakta ............ 365/199 | | 2006/0112214 A1 | 5/2006 | Yeh ............ 711/103 |
| 2005/0021874 A1 | 1/2005 | Georgiou ............ 709/250 | | 2006/0117160 A1 | 6/2006 | Jackson et al. ............ 711/170 |
| 2005/0024963 A1 | 2/2005 | Jakobs ............ 365/202 | | 2006/0120193 A1 | 6/2006 | Casper ............ 365/222 |
| 2005/0036350 A1 | 2/2005 | So et al. ............ 365/63 | | 2006/0123265 A1 | 6/2006 | Ruckerbauer ............ 713/500 |
| 2005/0041504 A1 | 2/2005 | Perego et al. ............ 365/222 | | 2006/0126369 A1 | 6/2006 | Raghuram ............ 365/51 |
| 2005/0044303 A1 | 2/2005 | Perego et al. ............ 711/5 | | 2006/0129712 A1 | 6/2006 | Raghuram ............ 710/52 |
| 2005/0044305 A1 | 2/2005 | Jakobs ............ 711/105 | | 2006/0129755 A1 | 6/2006 | Raghuram ............ 711/105 |
| 2005/0071543 A1 | 3/2005 | Ellis et al. ............ 711/106 | | 2006/0133173 A1 | 6/2006 | Jain et al. ............ 365/222 |
| 2005/0078532 A1 | 4/2005 | Ruckerbauer et al. ...... 365/199 | | 2006/0176744 A1 | 8/2006 | Stave ............ 365/194 |
| 2005/0081085 A1 | 4/2005 | Ellis et al. ............ 714/5 | | 2006/0179333 A1 | 8/2006 | Brittain et al. ............ 713/320 |
| 2005/0099834 A1 | 5/2005 | Funaba et al. ............ 365/63 | | 2006/0179335 A1 | 8/2006 | Brittain et al. ............ 713/320 |
| 2005/0105318 A1 | 5/2005 | Funaba et al. ............ 365/63 | | 2006/0198178 A1 | 9/2006 | Kinsley et al. ............ 365/52 |
| 2005/0138267 A1 | 6/2005 | Bains et al. ............ 711/100 | | 2006/0203590 A1 | 9/2006 | Mori et al. ............ 365/222 |
| 2005/0149662 A1 | 7/2005 | Perego ............ 711/5 | | 2006/0206738 A1 | 9/2006 | Jeddeloh et al. ............ 713/320 |
| 2005/0152212 A1 | 7/2005 | Yang ............ 365/233 | | 2006/0233012 A1 | 10/2006 | Sekiguchi et al. ............ 365/51 |
| 2005/0156934 A1 | 7/2005 | Perego et al. ............ 345/531 | | 2006/0262586 A1 | 11/2006 | Solomon et al. ............ 365/63 |
| 2005/0166026 A1 | 7/2005 | Ware et al. ............ 711/167 | | 2007/0070669 A1 | 3/2007 | Tsern ............ 365/51 |
| 2005/0193163 A1 | 9/2005 | Perego ............ 711/105 | | 2007/0088995 A1 | 4/2007 | Tsern et al. ............ 714/724 |
| 2005/0207255 A1 | 9/2005 | Perego et al. ............ 365/222 | | | | |
| 2005/0210196 A1 | 9/2005 | Perego et al. ............ 711/115 | | * cited by examiner | | |

INTERFACE CIRCUIT SYSTEM AND METHOD FOR PERFORMING POWER MANAGEMENT OPERATIONS IN CONJUNCTION WITH ONLY A PORTION OF A MEMORY CIRCUIT

RELATED APPLICATION(S)

The present application is a continuation-in-part of an application filed Jul. 31, 2006 under application Ser. No. 11/461,439, which is incorporated herein by reference for all purposes. However, insofar as any definitions, information used for claim interpretation, etc. from the above parent application conflict with that set forth herein, such definitions, information, etc. in the present application should apply.

FIELD OF THE INVENTION

The present invention relates to memory, and more particularly to power management in multiple memory circuit systems.

BACKGROUND

The memory capacity requirements of various systems are increasing rapidly. However, other industry trends such as higher memory bus speeds and small form factor machines, etc. are reducing the number of memory module slots in such systems. Thus, a need exists in the industry for larger capacity memory circuits to be used in such systems.

However, there is also a limit to the power that may be dissipated per unit volume in the space available to the memory circuits. As a result, large capacity memory modules may be limited in terms of power that the memory modules may dissipate, and/or limited in terms of the ability of power supply systems to deliver sufficient power to such memory modules. There is thus a need for overcoming these limitations and/or other problems associated with the prior art.

SUMMARY

A memory circuit power management system and method are provided. An interface circuit is in communication with a plurality of memory circuits and a system. In use, the interface circuit is operable to perform a power management operation in association with only a portion of the memory circuits

DETAILED DESCRIPTION

Power-Related Embodiments

Figure 1:
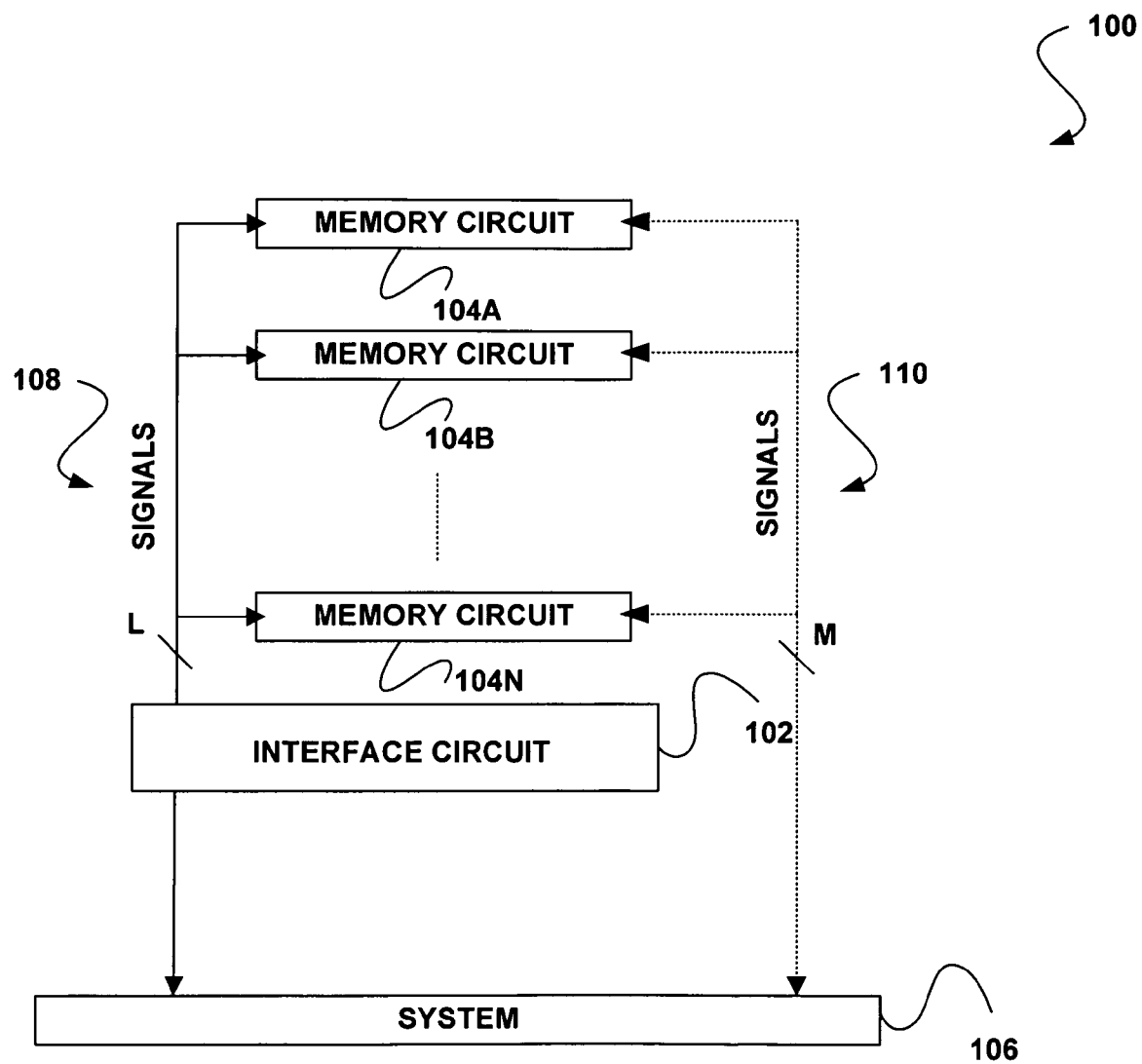
FIG. 1 illustrates a multiple memory circuit framework, in accordance with one embodiment.

FIG. 1 illustrates a multiple memory circuit framework 100, in accordance with one embodiment. As shown, included are an interface circuit 102, a plurality of memory circuits 104A, 104B, 104N, and a system 106. In the context of the present description, such memory circuits 104A, 104B, 104N may include any circuit capable of serving as memory.

For example, in various embodiments, at least one of the memory circuits 104A, 104B, 104N may include a monolithic memory circuit, a semiconductor die, a chip, a packaged memory circuit, or any other type of tangible memory circuit. In one embodiment, the memory circuits 104A, 104B, 104N may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), and/or any other type of DRAM.

In another embodiment, at least one of the memory circuits 104A, 104B, 104N may include magnetic random access memory (MRAM), intelligent random access memory (IRAM), distributed network architecture (DNA) memory, window random access memory (WRAM), flash memory (e.g. NAND, NOR, etc.), pseudostatic random access memory (PSRAM), wetware memory, memory based on semiconductor, atomic, molecular, optical, organic, biological, chemical, or nanoscale technology, and/or any other type of volatile or nonvolatile, random or non-random access, serial or parallel access memory circuit.

Strictly as an option, the memory circuits 104A, 104B, 104N may or may not be positioned on at least one dual in-line memory module (DIMM) (not shown). In various embodiments, the DIMM may include a registered DIMM (R-DIMM), a small outline-DIMM (SO-DIMM), a fully buffered DIMM (FB-DIMM), an unbuffered DIMM (UDIMM), single inline memory module (SIMM), a Mini-DIMM, a very low profile (VLP) R-DIMM, etc. In other embodiments, the memory circuits 104A, 104B, 104N may or may not be positioned on any type of material forming a substrate, card, module, sheet, fabric, board, carrier or other any other type of solid or flexible entity, form, or object. Of course, in other embodiments, the memory circuits 104A, 104B, 104N may or may not be positioned in or on any desired entity, form, or object for packaging purposes. Still yet, the memory circuits 104A, 104B, 104N may or may not be organized into ranks. Such ranks may refer to any arrangement of such memory circuits 104A, 104B, 104N on any of the foregoing entities, forms, objects, etc.

Further, in the context of the present description, the system 106 may include any system capable of requesting and/or initiating a process that results in an access of the memory circuits 104A, 104B, 104N. As an option, the system 106 may accomplish this utilizing a memory controller (not shown), or any other desired mechanism. In one embodiment, such system 106 may include a system in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The interface circuit 102 may, in the context of the present description, refer to any circuit capable of interfacing (e.g. communicating, buffering, etc.) with the memory circuits 104A, 104B, 104N and the system 106. For example, the interface circuit 102 may, in the context of different embodiments, include a circuit capable of directly (e.g. via wire, bus, connector, and/or any other direct communication medium, etc.) and/or indirectly (e.g. via wireless, optical, capacitive, electric field, magnetic field, electromagnetic field, and/or any other indirect communication medium, etc.) communicating with the memory circuits 104A, 104B, 104N and the system 106. In additional different embodiments, the communication may use a direct connection (e.g. point-to-point, single-drop bus, multi-drop bus, serial bus, parallel bus, link, and/or any other direct connection, etc.) or may use an indirect connection (e.g. through intermediate circuits, intermediate logic, an intermediate bus or busses, and/or any other indirect connection, etc.).

In additional optional embodiments, the interface circuit 102 may include one or more circuits, such as a buffer (e.g. buffer chip, etc.), register (e.g. register chip, etc.), advanced memory buffer (AMB) (e.g. AMB chip, etc.), a component positioned on at least one DIMM, etc. Moreover, the register may, in various embodiments, include a JEDEC Solid State Technology Association (known as JEDEC) standard register (a JEDEC register), a register with forwarding, storing, and/or buffering capabilities, etc. In various embodiments, the register chips, buffer chips, and/or any other interface circuit(s) 102 may be intelligent, that is, include logic that are capable of one or more functions such as gathering and/or storing information; inferring, predicting, and/or storing state and/or status; performing logical decisions; and/or performing operations on input signals, etc. In still other embodiments, the interface circuit 102 may optionally be manufactured in monolithic form, packaged form, printed form, and/or any other manufactured form of circuit, for that matter.

In still yet another embodiment, a plurality of the aforementioned interface circuits 102 may serve, in combination, to interface the memory circuits 104A, 104B, 104N and the system 106. Thus, in various embodiments, one, two, three, four, or more interface circuits 102 may be utilized for such interfacing purposes. In addition, multiple interface circuits 102 may be relatively configured or connected in any desired manner. For example, the interface circuits 102 may be configured or connected in parallel, serially, or in various combinations thereof. The multiple interface circuits 102 may use direct connections to each other, indirect connections to each other, or even a combination thereof. Furthermore, any number of the interface circuits 102 may be allocated to any number of the memory circuits 104A, 104B, 104N. In various other embodiments, each of the plurality of interface circuits 102 may be the same or different. Even still, the interface circuits 102 may share the same or similar interface tasks and/or perform different interface tasks.

While the memory circuits 104A, 104B, 104N, interface circuit 102, and system 106 are shown to be separate parts, it is contemplated that any of such parts (or portion(s) thereof) may be integrated in any desired manner. In various embodiments, such optional integration may involve simply packaging such parts together (e.g. stacking the parts to form a stack of DRAM circuits, a DRAM stack, a plurality of DRAM stacks, a hardware stack, where a stack may refer to any bundle, collection, or grouping of parts and/or circuits, etc.) and/or integrating them monolithically. Just by way of example, in one optional embodiment, at least one interface circuit 102 (or portion(s) thereof) may be packaged with at least one of the memory circuits 104A, 104B, 104N. Thus, a DRAM stack may or may not include at least one interface circuit (or portion(s) thereof). In other embodiments, different numbers of the interface circuit 102 (or portion(s) thereof) may be packaged together. Such different packaging arrangements, when employed, may optionally improve the utilization of a monolithic silicon implementation, for example.

The interface circuit 102 may be capable of various functionality, in the context of different embodiments. For example, in one optional embodiment, the interface circuit 102 may interface a plurality of signals 108 that are connected between the memory circuits 104A, 104B, 104N and the system 106. The signals may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections.

In one aspect of the present embodiment, the interfaced signals 108 may represent all of the signals that are connected between the memory circuits 104A, 104B, 104N and the system 106. In other aspects, at least a portion of signals 110 may use direct connections between the memory circuits 104A, 104B, 104N and the system 106. Moreover, the number of interfaced signals 108 (e.g. vs. a number of the signals that use direct connections 110, etc.) may vary such that the interfaced signals 108 may include at least a majority of the total number of signal connections between the memory circuits 104A, 104B, 104N and the system 106 (e.g. L>M, with L and M as shown in FIG. 1). In other embodiments, L may be less than or equal to M. In still other embodiments L and/or M may be zero.

In yet another embodiment, the interface circuit 102 may or may not be operable to interface a first number of memory circuits 104A, 104B, 104N and the system 106 for simulating a second number of memory circuits to the system 106. The first number of memory circuits 104A, 104B, 104N shall hereafter be referred to, where appropriate for clarification purposes, as the "physical" memory circuits or memory circuits, but are not limited to be so. Just by way of example, the physical memory circuits may include a single physical memory circuit. Further, the at least one simulated memory circuit seen by the system 106 shall hereafter be referred to, where appropriate for clarification purposes, as the at least one "virtual" memory circuit.

In still additional aspects of the present embodiment, the second number of virtual memory circuits may be more than, equal to, or less than the first number of physical memory circuits 104A, 104B, 104N. Just by way of example, the second number of virtual memory circuits may include a single memory circuit. Of course, however, any number of memory circuits may be simulated.

In the context of the present description, the term simulated may refer to any simulating, emulating, disguising, transforming, modifying, changing, altering, shaping, converting, etc., that results in at least one aspect of the memory circuits 104A, 104B, 104N appearing different to the system 106. In different embodiments, such aspect may include, for example, a number, a signal, a memory capacity, a timing, a latency, a design parameter, a logical interface, a control system, a property, a behavior (e.g. power behavior including, but not limited to a power consumption, current consumption, current waveform, power parameters, power metrics, any other aspect of power management or behavior, etc.), and/or any other aspect, for that matter.

In different embodiments, the simulation may be electrical in nature, logical in nature, protocol in nature, and/or performed in any other desired manner. For instance, in the context of electrical simulation, a number of pins, wires, signals, etc. may be simulated. In the context of logical simulation, a particular function or behavior may be simulated. In the context of protocol, a particular protocol (e.g. DDR3, etc.) may be simulated. Further, in the context of protocol, the simulation may effect conversion between different protocols (e.g. DDR2 and DDR3) or may effect conversion between different versions of the same protocol (e.g. conversion of 4-4-4 DDR2 to 6-6-6 DDR2).

During use, in accordance with one optional power management embodiment, the interface circuit 102 may or may not be operable to interface the memory circuits 104A, 104B, 104N and the system 106 for simulating at least one virtual memory circuit, where the virtual memory circuit includes at least one aspect that is different from at least one aspect of one or more of the physical memory circuits 104A, 104B, 104N. Such aspect may, in one embodiment, include power behavior (e.g. a power consumption, current consumption, current waveform, any other aspect of power management or behavior, etc.). Specifically, in such embodiment, the interface circuit 102 is operable to interface the physical memory circuits 104A, 104B, 104N and the system 106 for simulating at least one virtual memory circuit with a first power behavior that is different from a second power behavior of the physical memory circuits 104A, 104B, 104N. Such power behavior simulation may effect or result in a reduction or other modification of average power consumption, reduction or other modification of peak power consumption or other measure of power consumption, reduction or other modification of peak current consumption or other measure of current consumption, and/or modification of other power behavior (e.g. parameters, metrics, etc.). In one embodiment, such power behavior simulation may be provided by the interface circuit 102 performing various power management.

In another power management embodiment, the interface circuit 102 may perform a power management operation in association with only a portion of the memory circuits. In the context of the present description, a portion of memory circuits may refer to any row, column, page, bank, rank, sub-row, sub-column, sub-page, sub-bank, sub-rank, any other subdivision thereof, and/or any other portion or portions of one or more memory circuits. Thus, in an embodiment where multiple memory circuits exist, such portion may even refer to an entire one or more memory circuits (which may be deemed a portion of such multiple memory circuits, etc.). Of course, again, the portion of memory circuits may refer to any portion or portions of one or more memory circuits. This applies to both physical and virtual memory circuits.

In various additional power management embodiments, the power management operation may be performed by the interface circuit 102 during a latency associated with one or more commands directed to at least a portion of the plurality of memory circuits 104A, 104B, 104N. In the context of the present description, such command(s) may refer to any control signal (e.g. one or more address signals; one or more data signals; a combination of one or more control signals; a sequence of one or more control signals; a signal associated with an activate (or active) operation, precharge operation, write operation, read operation, a mode register write operation, a mode register read operation, a refresh operation, or other encoded or direct operation, command or control signal; etc.). In one optional embodiment where the interface circuit 102 is further operable for simulating at least one virtual memory circuit, such virtual memory circuit (s) may include a first latency that is different than a second latency associated with at least one of the plurality of memory circuits 104A, 104B, 104N. In use, such first latency may be used to accommodate the power management operation.

Yet another embodiment is contemplated where the interface circuit 102 performs the power management operation in association with at least a portion of the memory circuits, in an autonomous manner. Such autonomous performance refers to the ability of the interface circuit 102 to perform the power management operation without necessarily requiring the receipt of an associated power management command from the system 106.

In still additional embodiments, interface circuit 102 may receive a first number of power management signals from the system 106 and may communicate a second number of power management signals that is the same or different from the first number of power management signals to at least a portion of the memory circuits 104A, 104B, 104N. In the context of the present description, such power management signals may refer to any signal associated with power management, examples of which will be set forth hereinafter during the description of other embodiments. In still another embodiment, the second number of power management signals may be utilized to perform power management of the portion(s) of memory circuits in a manner that is independent from each other and/or independent from the first number of power management signals received from the system 106 (which may or may not also be utilized in a manner that is independent from each other). In even still yet another embodiment where the interface circuit 102 is further operable for simulating at least one virtual memory circuit, a number of the aforementioned ranks (seen by the system 106) may be less than the first number of power management signals.

In other power management embodiments, the interface circuit 102 may be capable of a power management operation that takes the form of a power saving operation. In the context of the present description, the term power saving operation may refer to any operation that results in at least some power savings.

It should be noted that various power management operation embodiments, power management signal embodiments, simulation embodiments (and any other embodiments, for that matter) may or may not be used in conjunction with each other, as well as the various different embodiments that will hereinafter be described. To this end, more illustrative information will now be set forth regarding optional functionality/architecture of different embodiments which may or may not be implemented in the context of such interface circuit 102 and the related components of FIG. 1, per the desires of the user. It should be strongly noted that the following information is set forth for illustrative purposes and should not be construed as limiting in any manner. For example, any of the following features may be optionally incorporated with or without the other features described.

Additional Power Management Embodiments

In one exemplary power management embodiment, the aforementioned simulation of a different power behavior may be achieved utilizing a power saving operation.

In one such embodiment, the power management, power behavior simulation, and thus the power saving operation may optionally include applying a power saving command to one or more memory circuits based on at least one state of one or more memory circuits. Such power saving command may include, for example, initiating a power down operation applied to one or more memory circuits. Further, such state may depend on identification of the current, past or predictable future status of one or more memory circuits, a predetermined combination of commands issued to the one or more memory circuits, a predetermined pattern of commands issued to the one or more memory circuits, a predetermined absence of commands issued to the one or more memory circuits, any command(s) issued to the one or more memory circuits, and/or any command(s) issued to one or more memory circuits other than the one or more memory circuits. In the context of the present description, such status may refer to any property of the memory circuit that may be monitored, stored, and/or predicted.

For example, at least one of a plurality of memory circuits may be identified that is not currently being accessed by the system. Such status identification may involve determining whether a portion(s) is being accessed in at least one of the plurality of memory circuits. Of course, any other technique may be used that results in the identification of at least one of the memory circuits (or portion(s) thereof) that is not being accessed, e.g. in a non-accessed state. In other embodiments, other such states may be detected or identified and used for power management.

In response to the identification of a memory circuit in a non-accessed state, a power saving operation may be initiated in association with the non-accessed memory circuit (or portion thereof). In one optional embodiment, such power saving operation may involve a power down operation (e.g. entry into a precharge power down mode, as opposed to an exit therefrom, etc.). As an option, such power saving operation may be initiated utilizing (e.g. in response to, etc.) a power management signal including, but not limited to a clock enable signal (CKE), chip select signal, in combination with other signals and optionally commands. In other embodiments, use of a non-power management signal (e.g. control signal, etc.) is similarly contemplated for initiating the power saving operation. Of course, however, it should be noted that anything that results in modification of the power behavior may be employed in the context of the present embodiment.

As mentioned earlier, the interface circuit may be operable to interface the memory circuits and the system for simulating at least one virtual memory circuit, where the virtual memory circuit includes at least one aspect that is different from at least one aspect of one or more of the physical memory circuits. In different embodiments, such aspect may include, for example, a signal, a memory capacity, a timing, a logical interface, etc. As an option, one or more of such aspects may be simulated for supporting a power management operation.

For example, the simulated timing, as described above, may include a simulated latency (e.g. time delay, etc.). In particular, such simulated latency may include a column address strobe (CAS) latency (e.g. a latency associated with accessing a column of data). Still yet, the simulated latency may include a row address to column address latency (tRCD). Thus, the latency may be that between the row address strobe (RAS) and CAS.

In addition, the simulated latency may include a row precharge latency (tRP). The tRP may include the latency to terminate access to an open row. Further, the simulated latency may include an activate to precharge latency (tRAS). The tRAS may include the latency between an activate operation and a precharge operation. Furthermore, the simulated latency may include a row cycle time (tRC). The tRC may include the latency between consecutive activate operations to the same bank of a DRAM circuit. In some embodiments, the simulated latency may include a read latency, write latency, or latency associated with any other operation (s), command(s), or combination or sequence of operations or commands. In other embodiments, the simulated latency may include simulation of any latency parameter that corresponds to the time between two events.

For example, in one exemplary embodiment using simulated latency, a first interface circuit may delay address and control signals for certain operations or commands by a clock cycles. In various embodiments where the first interface circuit is operating as a register or may include a register, a may not necessarily include the register delay (which is typically a one clock cycle delay through a JEDEC register). Also in the present exemplary embodiment, a second interface circuit may delay data signals by d clock cycles. It should be noted that the first and second interface circuits may be the same or different circuits or components in various embodiments. Further, the delays a and d may or may not be different for different memory circuits. In other embodiments, the delays a and d may apply to address and/or control and/or data signals. In alternative embodiments, the delays a and d may not be integer or even constant multiples of the clock cycle and may be less than one clock cycle or zero.

The cumulative delay through the interface circuits (e.g. the sum of the first delay a of the address and control signals through the first interface circuit and the second delay d of the data signals through the second interface circuit) may be j clock cycles (e.g. j=a+d). Thus, in a DRAM-specific embodiment, in order to make the delays a and d transparent to the memory controller, the interface circuits may make the stack of DRAM circuits appear to a memory controller (or any other component, system, or part(s) of a system) as one (or more) larger capacity virtual DRAM circuits with a read latency of i+j clocks, where i is the inherent read latency of the physical DRAM circuits.

To this end, the interface circuits may be operable for simulating at least one virtual memory circuit with a first latency that may be different (e.g. equal, longer, shorter, etc.) than a second latency of at least one of the physical memory circuits. The interface circuits may thus have the ability to simulate virtual DRAM circuits with a possibly different (e.g. increased, decreased, equal, etc.) read or other latency to the system, thus making transparent the delay of some or all of the address, control, clock, enable, and data signals through the interface circuits. This simulated aspect, in turn, may be used to accommodate power management of the DRAM circuits. More information regarding such use will be set forth hereinafter in greater detail during reference to different embodiments outlined in subsequent figures.

In still another embodiment, the interface circuit may be operable to receive a signal from the system and communicate the signal to at least one of the memory circuits after a delay. The signal may refer to one of more of a control signal, a data signal, a clock signal, an enable signal, a reset signal, a logical or physical signal, a combination or pattern of such signals, or a sequence of such signals, and/or any other signal for that matter. In various embodiments, such delay may be fixed or variable (e.g. a function of a current signal, and/or a previous signal, and/or a signal that will be communicated, after a delay, at a future time, etc.). In still other embodiments, the interface circuit may be operable to receive one or more signals from at least one of the memory circuits and communicate the signal(s) to the system after a delay.

As an option, the signal delay may include a cumulative delay associated with one or more of the aforementioned signals. Even still, the signal delay may result in a time shift of the signal (e.g. forward and/or back in time) with respect to other signals. Of course, such forward and backward time shift may or may not be equal in magnitude.

In one embodiment, the time shifting may be accomplished utilizing a plurality of delay functions which each apply a different delay to a different signal. In still additional embodiments, the aforementioned time shifting may be coordinated among multiple signals such that different signals are subject to shifts with different relative directions/magnitudes. For example, such time shifting may be performed in an organized manner. Yet again, more information regarding such use of delay in the context of power management will be set forth hereinafter in greater detail during reference to subsequent figures.

Embodiments with Varying Physical Stack Arrangements

FIGS. 2A-E show a stack of DRAM circuits 200 that utilize one or more interface circuits, in accordance with various embodiments. As an option, the stack of DRAM circuits 200 may be implemented in the context of the architecture of FIG. 1. Of course, however, the stack of DRAM circuits 200 may be implemented in any other desired environment (e.g. using other memory types, using different memory types within a stack, etc.). It should also be noted that the aforementioned definitions may apply during the present description.

As shown in FIGS. 2A-E, one or more interface circuits 202 may be placed electrically between an electronic system 204 and a stack of DRAM circuits 206A-D. Thus the interface circuits 202 electrically sit between the electronic system 204 and the stack of DRAM circuits 206A-D. In the context of the present description, the interface circuit(s) 202 may include any interface circuit that meets the definition set forth during reference to FIG. 1.

In the present embodiment, the interface circuit(s) 202 may be capable of interfacing (e.g. buffering, etc.) the stack of DRAM circuits 206A-D to electrically and/or logically resemble at least one larger capacity virtual DRAM circuit to the system 204. Thus, a stack or buffered stack may be utilized. In this way, the stack of DRAM circuits 206A-D may appear as a smaller quantity of larger capacity virtual DRAM circuits to the system 204.

Just by way of example, the stack of DRAM circuits 206A-D may include eight 512 Mb DRAM circuits. Thus, the interface circuit(s) 202 may buffer the stack of eight 512 Mb DRAM circuits to resemble a single 4 Gb virtual DRAM circuit to a memory controller (not shown) of the associated system 204. In another example, the interface circuit(s) 202 may buffer the stack of eight 512 Mb DRAM circuits to resemble two 2 Gb virtual DRAM circuits to a memory controller of an associated system 204.

Furthermore, the stack of DRAM circuits 206A-D may include any number of DRAM circuits. Just by way of example, the interface circuit(s) 202 may be connected to 1, 2, 4, 8 or more DRAM circuits 206A-D. In alternate embodiments, to permit data integrity storage or for other reasons, the interface circuit(s) 202 may be connected to an odd number of DRAM circuits 206A-D. Additionally, the DRAM circuits 206A-D may be arranged in a single stack. Of course, however, the DRAM circuits 206A-D may also be arranged in a plurality of stacks The DRAM circuits 206A-D may be arranged on, located on, or connected to a single side of the interface circuit(s) 202, as shown in FIGS. 2A-D. As another option, the DRAM circuits 206A-D may be arranged on, located on, or connected to both sides of the interface circuit(s) 202 shown in FIG. 2E. Just by way of example, the interface circuit(s) 202 may be connected to 16 DRAM circuits with 8 DRAM circuits on either side of the interface circuit(s) 202, where the 8 DRAM circuits on each side of the interface circuit(s) 202 are arranged in two stacks of four DRAM circuits. In other embodiments, other arrangements and numbers of DRAM circuits are possible (e.g. to implement error-correction coding, ECC, etc.)

The interface circuit(s) 202 may optionally be a part of the stack of DRAM circuits 206A-D. Of course, however, interface circuit(s) 202 may also be separate from the stack of DRAM circuits 206A-D. In addition, interface circuit(s) 202 may be physically located anywhere in the stack of DRAM circuits 206A-D, where such interface circuit(s) 202 electrically sits between the electronic system 204 and the stack of DRAM circuits 206A-D.

In one embodiment, the interface circuit(s) 202 may be located at the bottom of the stack of DRAM circuits 206A-D (e.g. the bottom-most circuit in the stack) as shown in FIGS. 2A-2D. As another option, and as shown in FIG. 2E, the interface circuit(s) 202 may be located in the middle of the stack of DRAM circuits 206A-D. As still yet another option, the interface circuit(s) 202 may be located at the top of the stack of DRAM circuits 206A-D (e.g. the top-most circuit in the stack). Of course, however, the interface circuit(s) 202 may also be located anywhere between the two extremities of the stack of DRAM circuits 206A-D. In alternate embodiments, the interface circuit(s) 202 may not be in the stack of DRAM circuits 206A-D and may be located in a separate package(s).

The electrical connections between the interface circuit(s) 202 and the stack of DRAM circuits 206A-D may be configured in any desired manner. In one optional embodiment, address, control (e.g. command, etc.), and clock signals may be common to all DRAM circuits 206A-D in the stack (e.g. using one common bus). As another option, there may be multiple address, control and clock busses.

As yet another option, there may be individual address, control and clock busses to each DRAM circuit 206A-D. Similarly, data signals may be wired as one common bus, several busses, or as an individual bus to each DRAM circuit 206A-D. Of course, it should be noted that any combinations of such configurations may also be utilized.

Figure 2A:
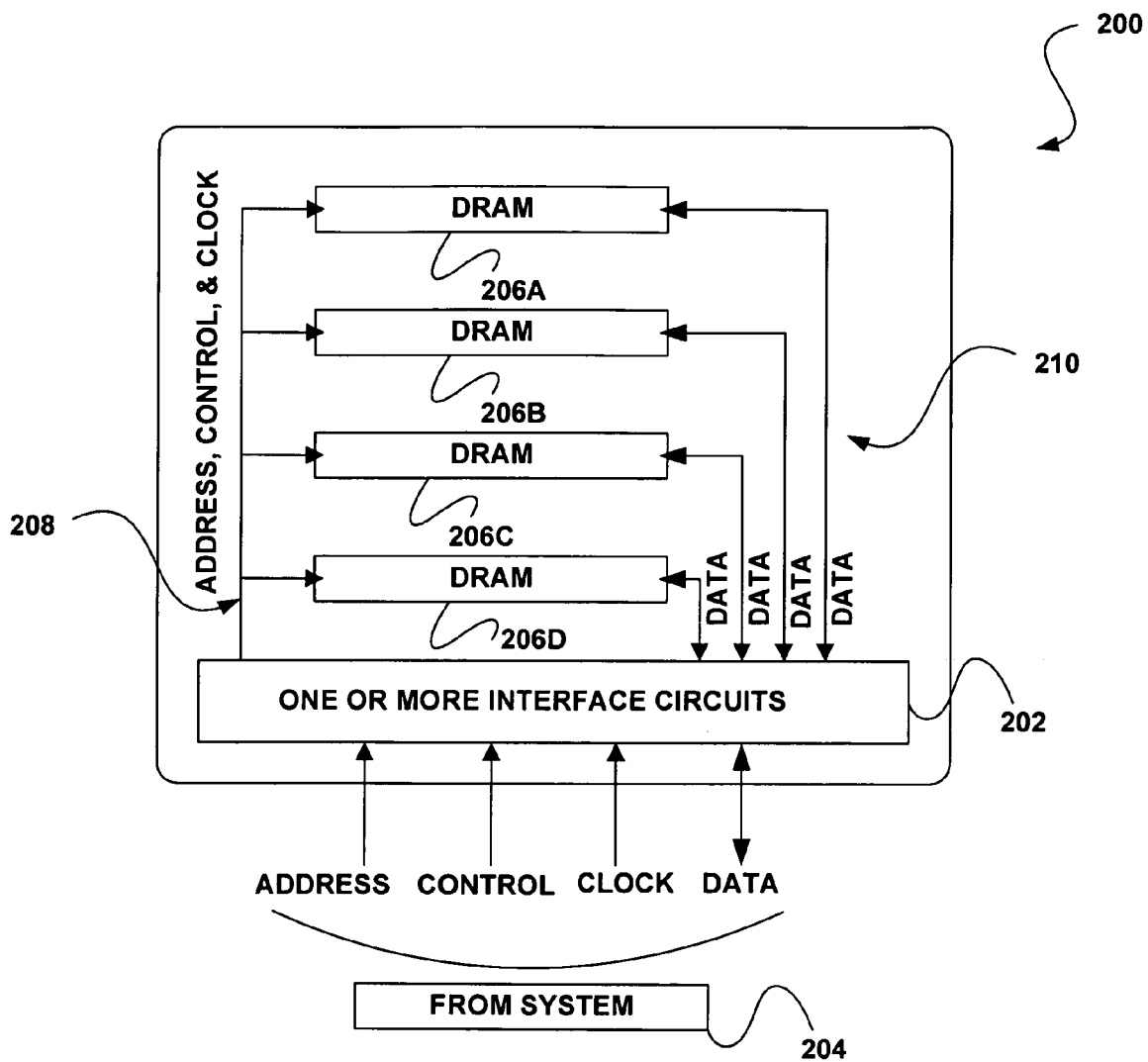
FIGS. 2A-E show a stack of dynamic random access memory (DRAM) circuits that utilize one or more interface circuits, in accordance with various embodiments.
Figure 2B:
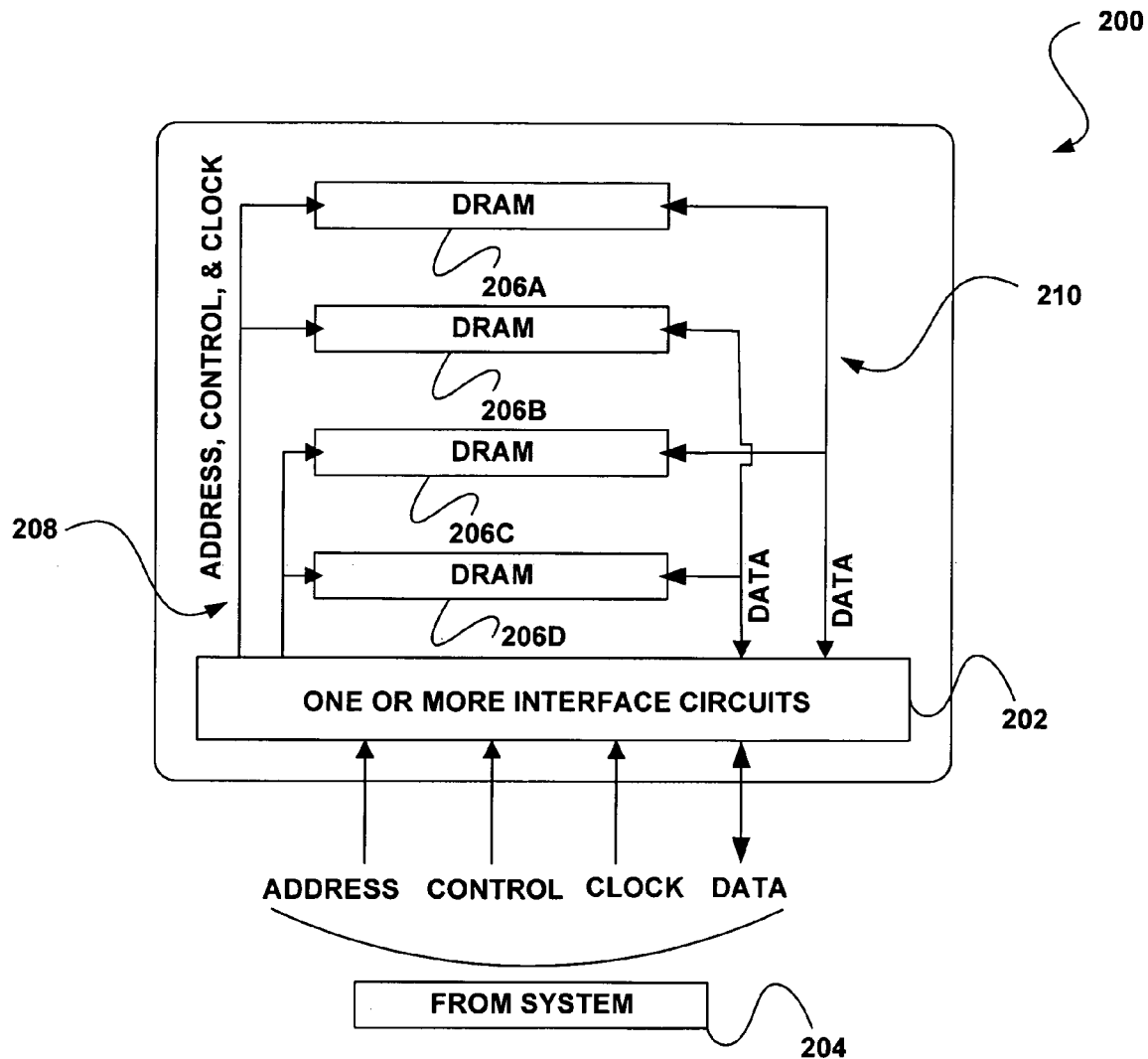
Figure 2C:
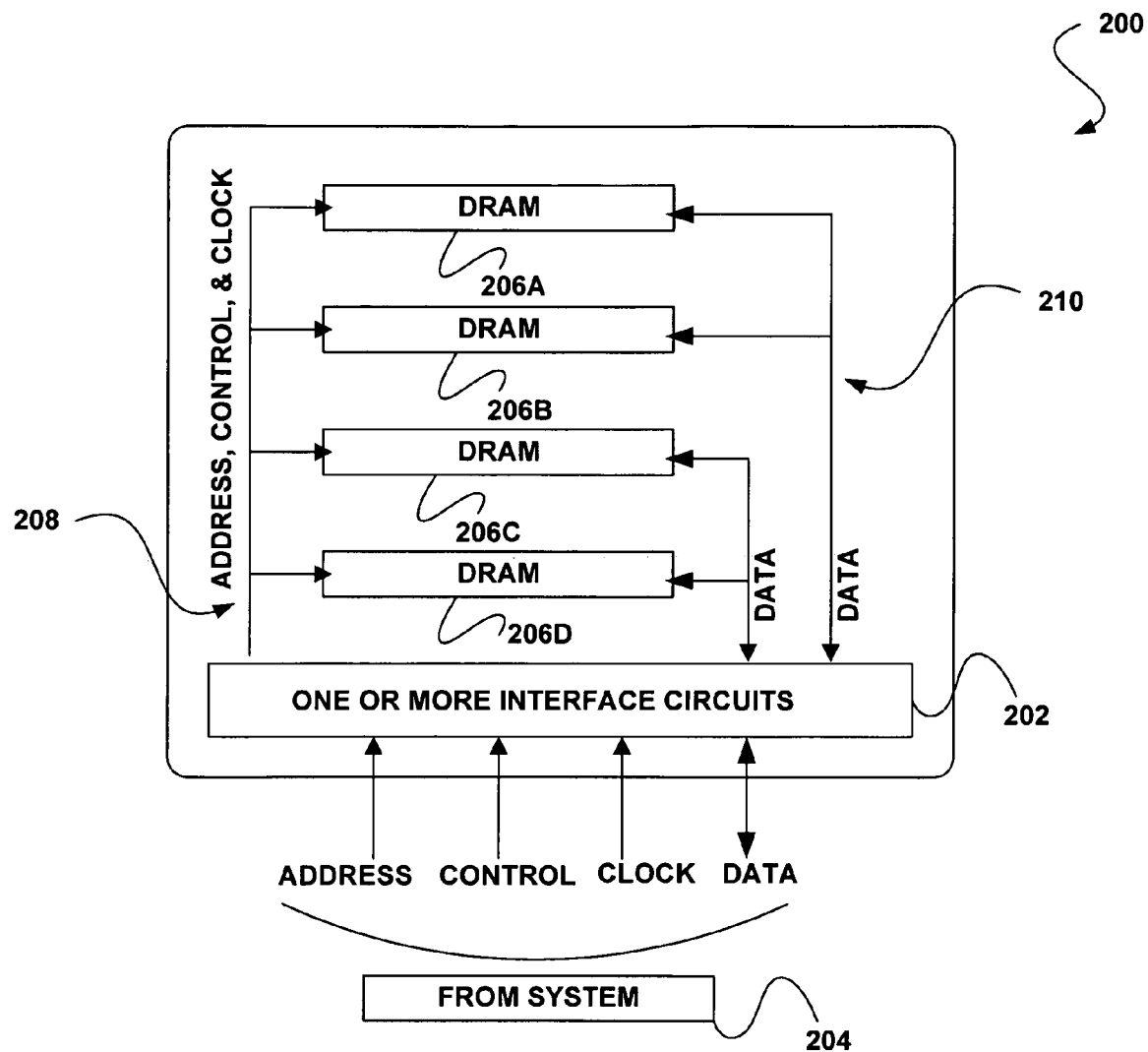
Figure 2D:
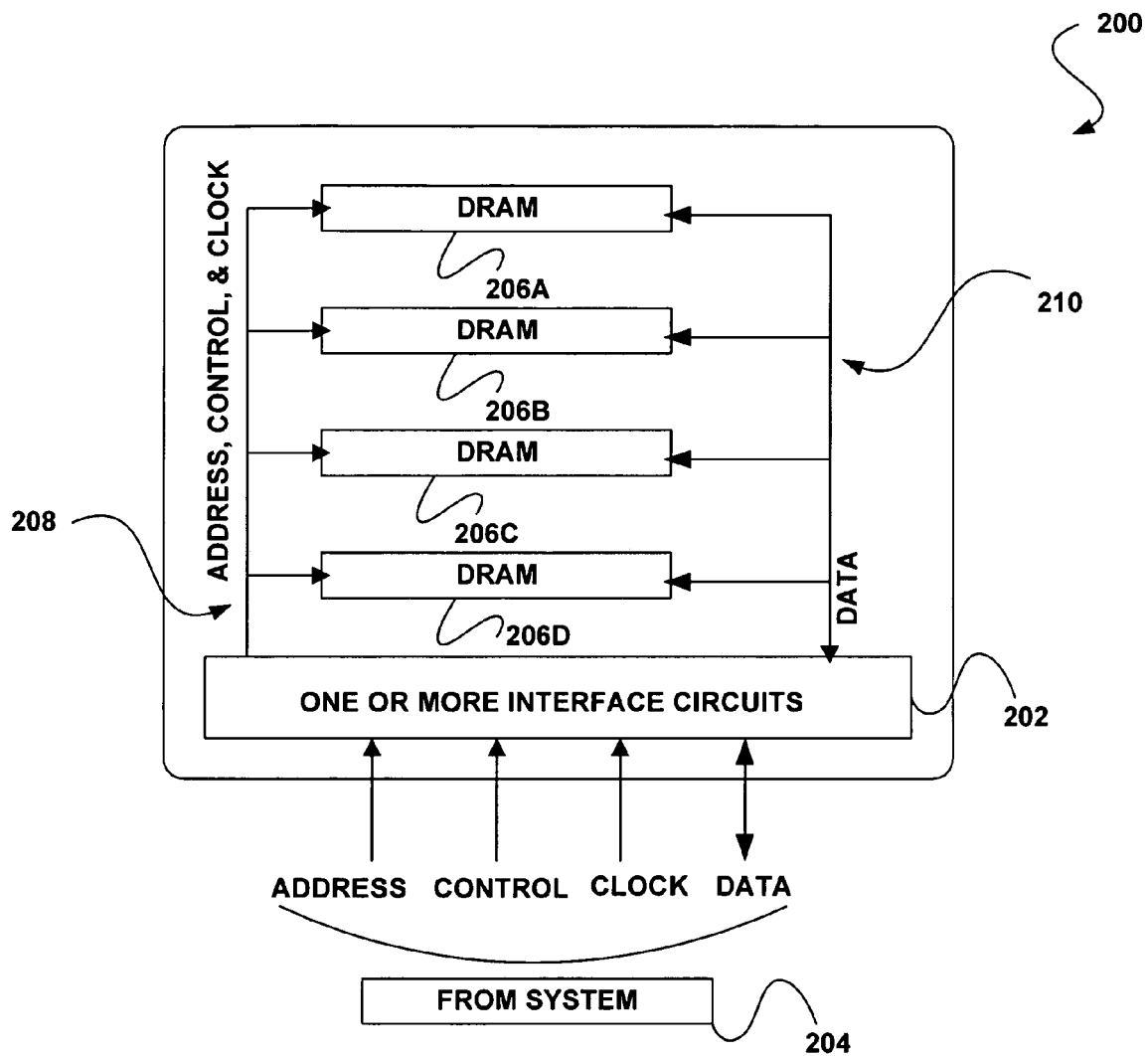
Figure 2E:
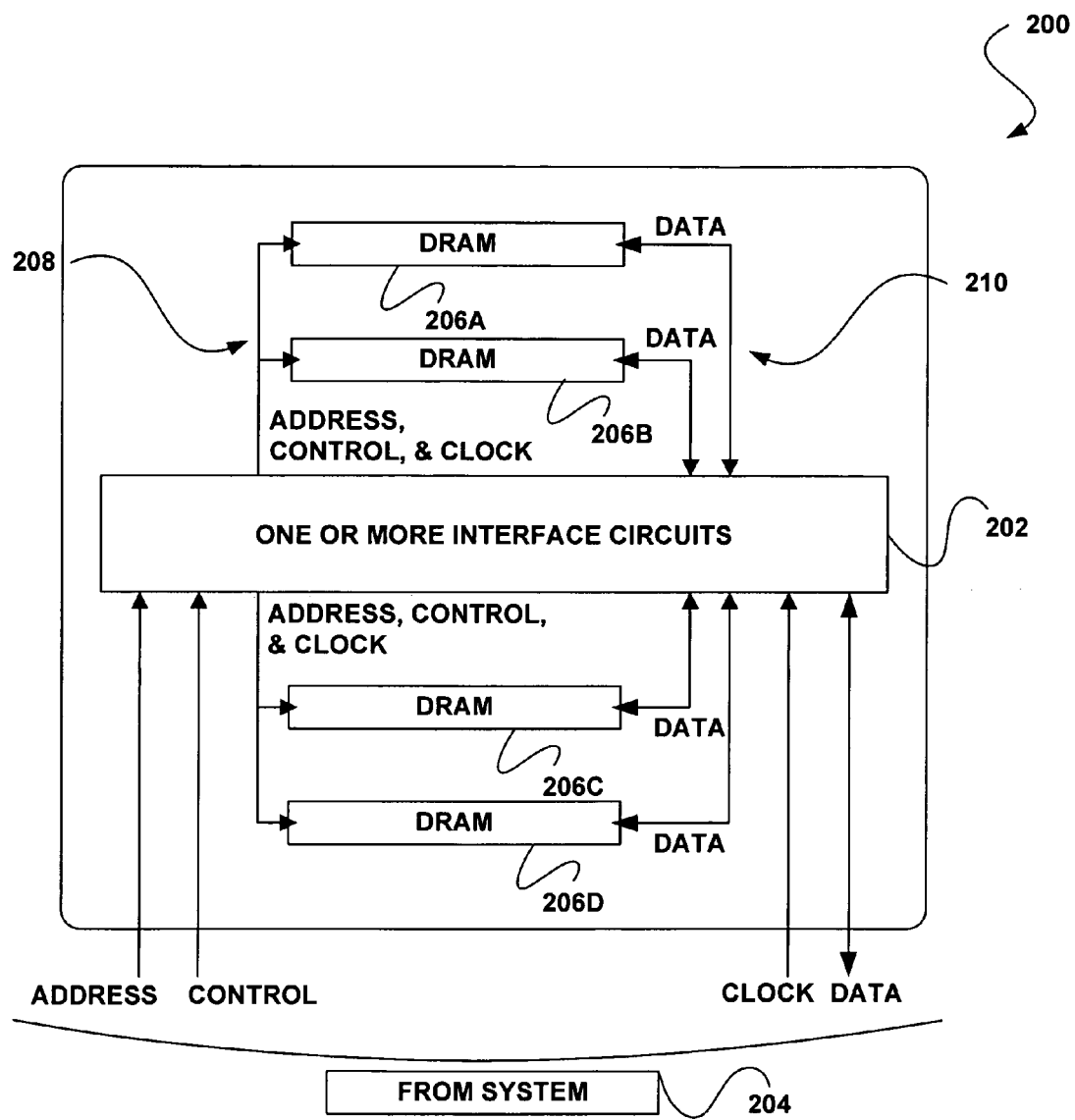

For example, as shown in FIG. 2A, the DRAM circuits 206A-D may have one common address, control and clock bus 208 with individual data busses 210. In another example, as shown in FIG. 2B, the DRAM circuits 206A-D may have two address, control and clock busses 208 along with two data busses 210. In still yet another example, as shown in FIG. 2C, the DRAM circuits 206A-D may have one address, control and clock bus 208 together with two data busses 210. In addition, as shown in FIG. 2D, the DRAM circuits 206A-D may have one common address, control and clock bus 208 and one common data bus 210. It should be noted that any other permutations and combinations of such address, control, clock and data buses may be utilized.

In one embodiment, the interface circuit(s) 202 may be split into several chips that, in combination, perform power management functions. Such power management functions may optionally introduce a delay in various signals.

For example, there may be a single register chip that electrically sits between a memory controller and a number of stacks of DRAM circuits. The register chip may, for example, perform the signaling to the DRAM circuits. Such register chip may be connected electrically to a number of other interface circuits that sit electrically between the register chip and the stacks of DRAM circuits. Such interface circuits in the stacks of DRAM circuits may then perform the aforementioned delay, as needed.

In another embodiment, there may be no need for an interface circuit in each DRAM stack. In particular, the register chip may perform the signaling to the DRAM circuits directly. In yet another embodiment, there may be no need for a stack of DRAM circuits. Thus each stack may be a single memory (e.g. DRAM) circuit. In other implementations, combinations of the above implementations may be used. Just by way of example, register chips may be used in combination with other interface circuits, or registers may be utilized alone.

More information regarding the verification that a simulated DRAM circuit including any address, data, control and clock configurations behaves according to a desired DRAM standard or other design specification will be set forth hereinafter in greater detail.

Additional Embodiments with Different Physical Memory Module Arrangements

FIGS. 3A-D show a memory module 300 which uses DRAM circuits or stacks of DRAM circuits (e.g. DRAM stacks) with various interface circuits, in accordance with different embodiments. As an option, the memory module 300 may be implemented in the context of the architecture and environment of FIGS. 1 and/or 2. Of course, however, the memory module 300 may be implemented in any desired environment. It should also be noted that the aforementioned definitions may apply during the present description.

Figure 3A:
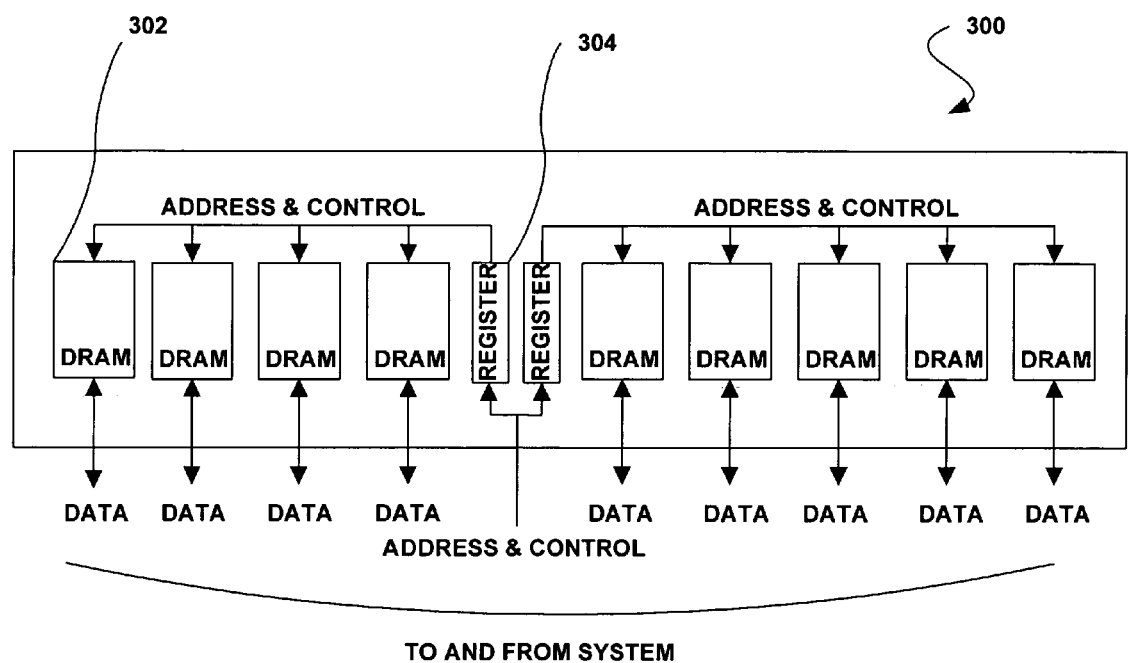
FIGS. 3A-D show a memory module which uses dynamic random access memory (DRAM) circuits with various interface circuits, in accordance with different embodiments.

FIG. 3A shows two register chips 304 driving address and control signals to DRAM circuits 302. The DRAM circuits 302 may send/receive data signals to and/or from a system (e.g. memory controller) using the DRAM data bus, as shown.

Figure 3B:
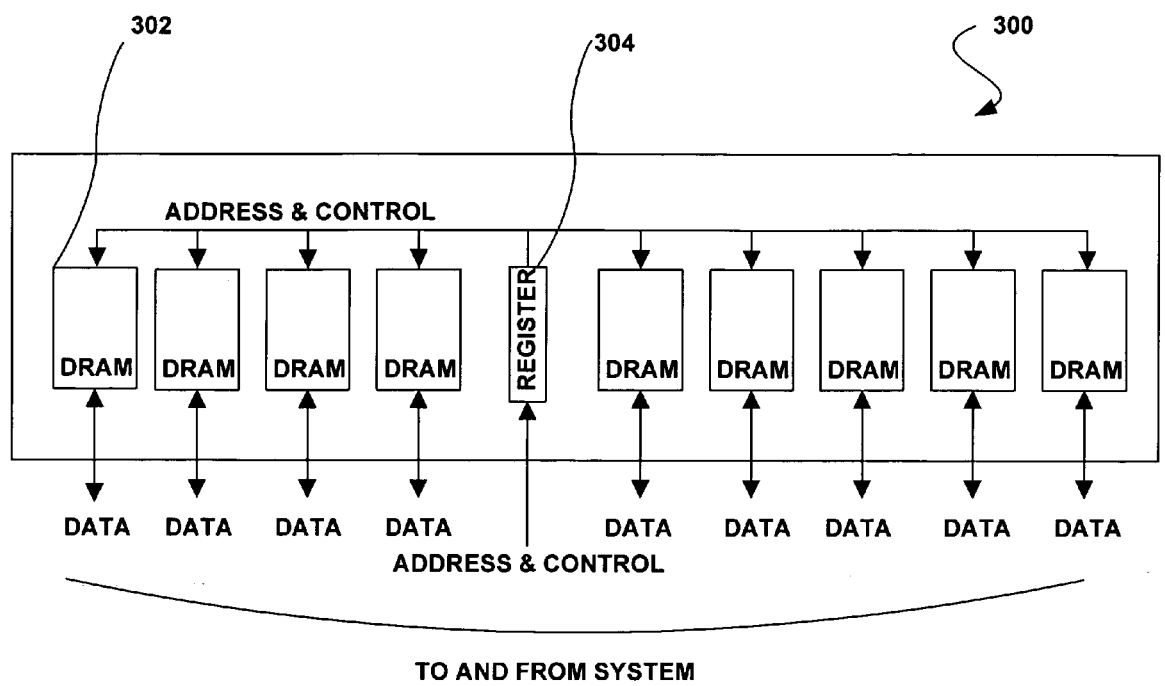

FIG. 3B shows one register chip 304 driving address and control signals to DRAM circuits 302. Thus, one, two, three, or more register chips 304 may be utilized, in various embodiments.

Figure 3C:
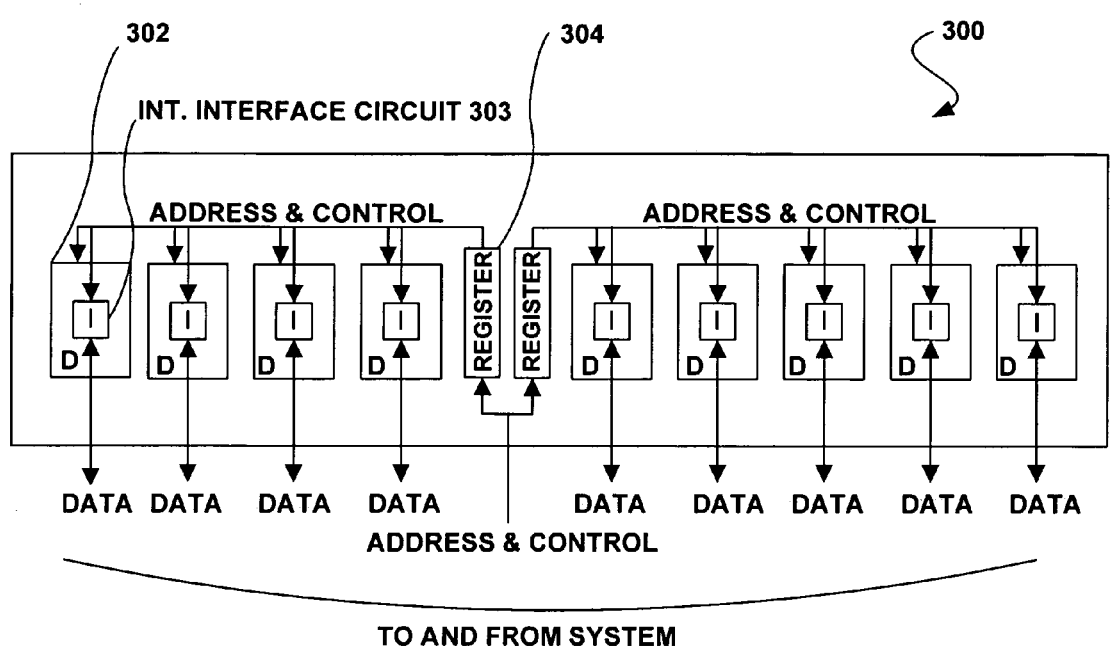

FIG. 3C shows register chips 304 driving address and control signals to DRAM circuits 302 and/or intelligent interface circuits 303. In addition, the DRAM data bus is connected to the intelligent interface circuits 303 (not shown explicitly). Of course, as described herein, and illustrated in FIGS. 3A and 3B, one, two, three or more register chips 304 may be used. Furthermore, this figure illustrates that the register chip(s) 304 may drive some, all, or none of the control and/or address signals to intelligent interface circuits 303.

Figure 3D:
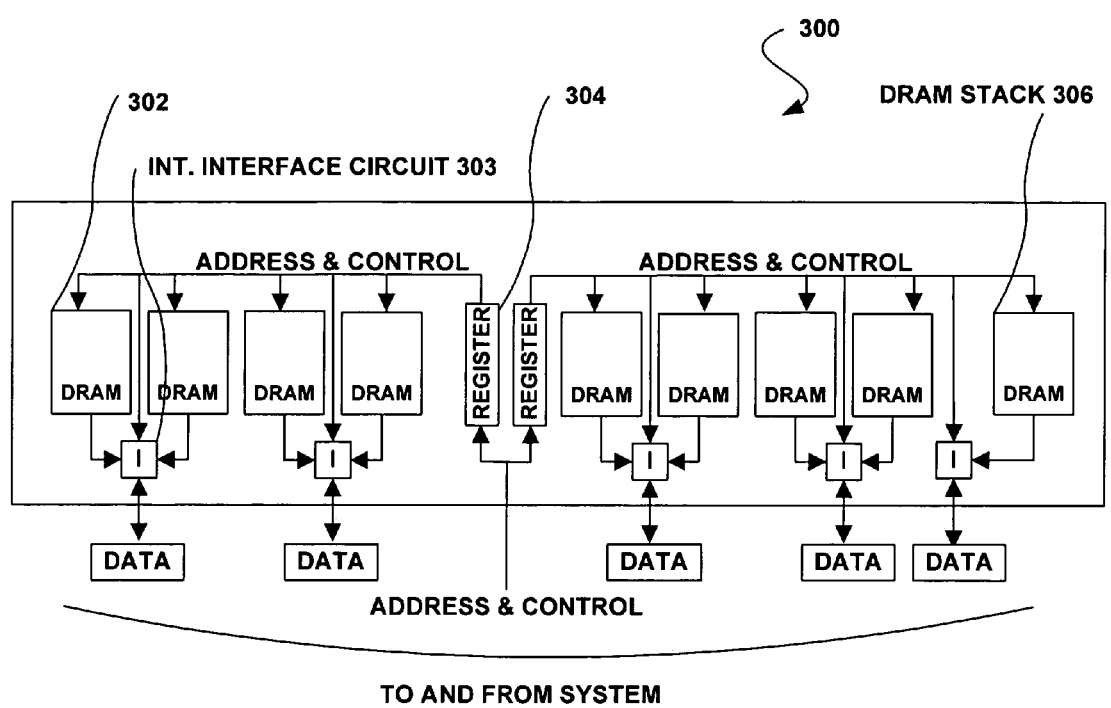

FIG. 3D shows register chips 304 driving address and control signals to the DRAM circuits 302 and/or intelligent interface circuits 303. Furthermore, this figure illustrates that the register chip(s) 304 may drive some, all, or none of the control and/or address signals to intelligent interface circuits 303. Again, the DRAM data bus is connected to the intelligent interface circuits 303. Additionally, this figure illustrates that either one (in the case of DRAM stack 306) or two (in the case of the other DRAM stacks 302) stacks of DRAM circuits 302 may be associated with a single intelligent interface circuit 303.

Of course, however, any number of stacks of DRAM circuits 302 may be associated with each intelligent interface circuit 303. As another option, an AMB chip may be utilized with an FB-DIMM, as will be described in more detail with respect to FIGS. 4A-E.

FIGS. 4A-E show a memory module 400 which uses DRAM circuits or stacks of DRAM circuits (e.g. DRAM stacks) 402 with an AMB chip 404, in accordance with various embodiments. As an option, the memory module 400 may be implemented in the context of the architecture and environment of FIGS. 1-3. Of course, however, the memory module 400 may be implemented in any desired environment. It should also be noted that the aforementioned definitions may apply during the present description.

Figure 4A:
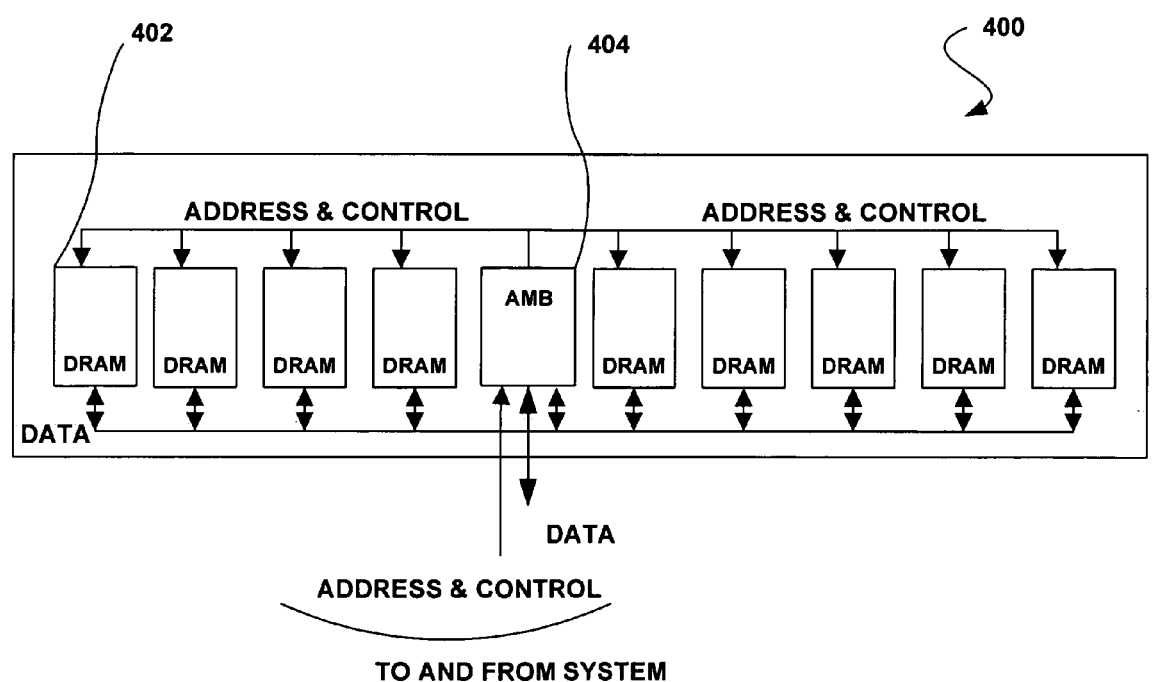
FIGS. 4A-E show a memory module which uses DRAM circuits with an advanced memory buffer (AMB) chip and various other interface circuits, in accordance with various embodiments.

FIG. 4A shows the AMB chip 404 driving address and control signals to the DRAM circuits 402. In addition, the AMB chip 404 sends/receives data to/from the DRAM circuits 402.

Figure 4B:
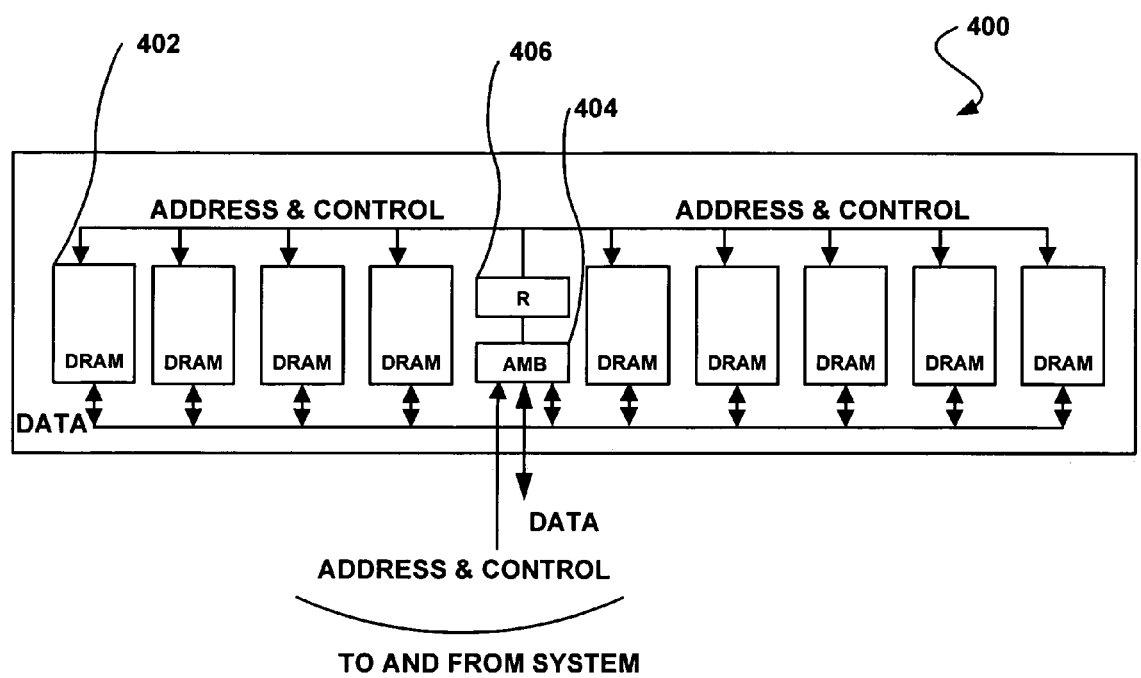

FIG. 4B shows the AMB chip 404 driving address and control signals to a register 406. In turn, the register 406 may drive address and control signals to the DRAM circuits 402. The DRAM circuits send/receive data to/from the AMB. Moreover, a DRAM data bus may be connected to the AMB chip 404.

Figure 4C:
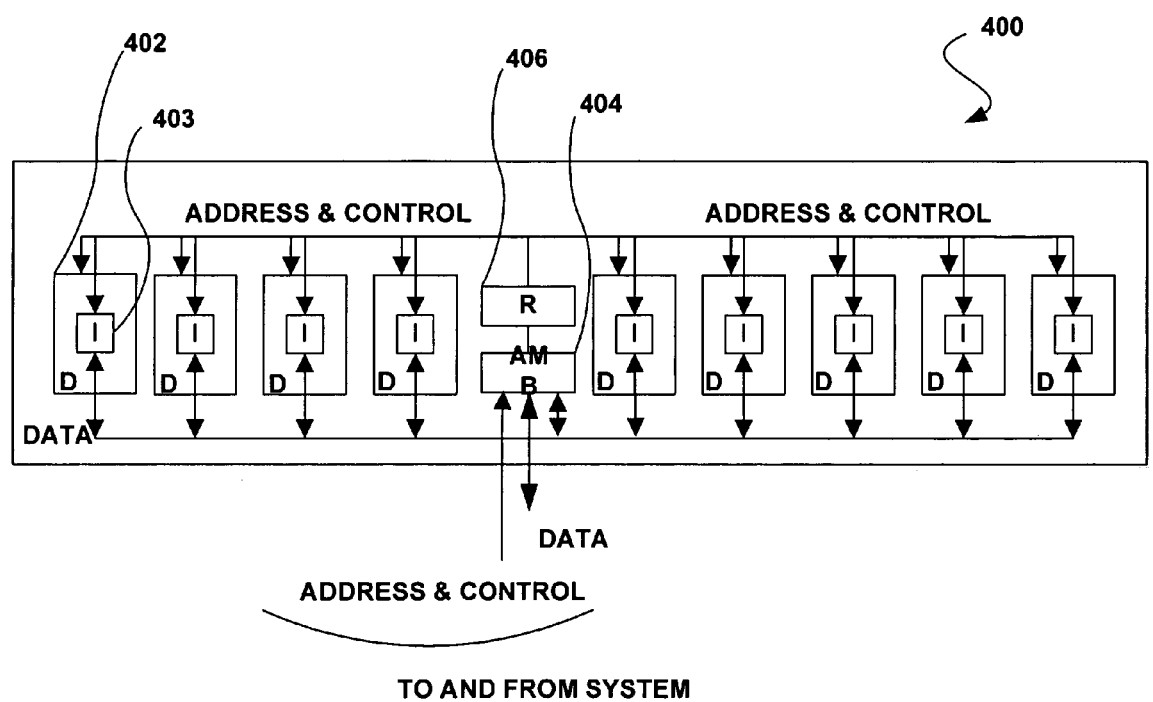

FIG. 4C shows the AMB chip 404 driving address and control to the register 406. In turn, the register 406 may drive address and control signals to the DRAM circuits 402 and/or the intelligent interface circuits 403. This figure illustrates that the register 406 may drive zero, one, or more address and/or control signals to one or more intelligent interface circuits 403. Further, each DRAM data bus is connected to the interface circuit 403 (not shown explicitly). The intelligent interface circuit data bus is connected to the AMB chip 404. The AMB data bus is connected to the system.

Figure 4D:
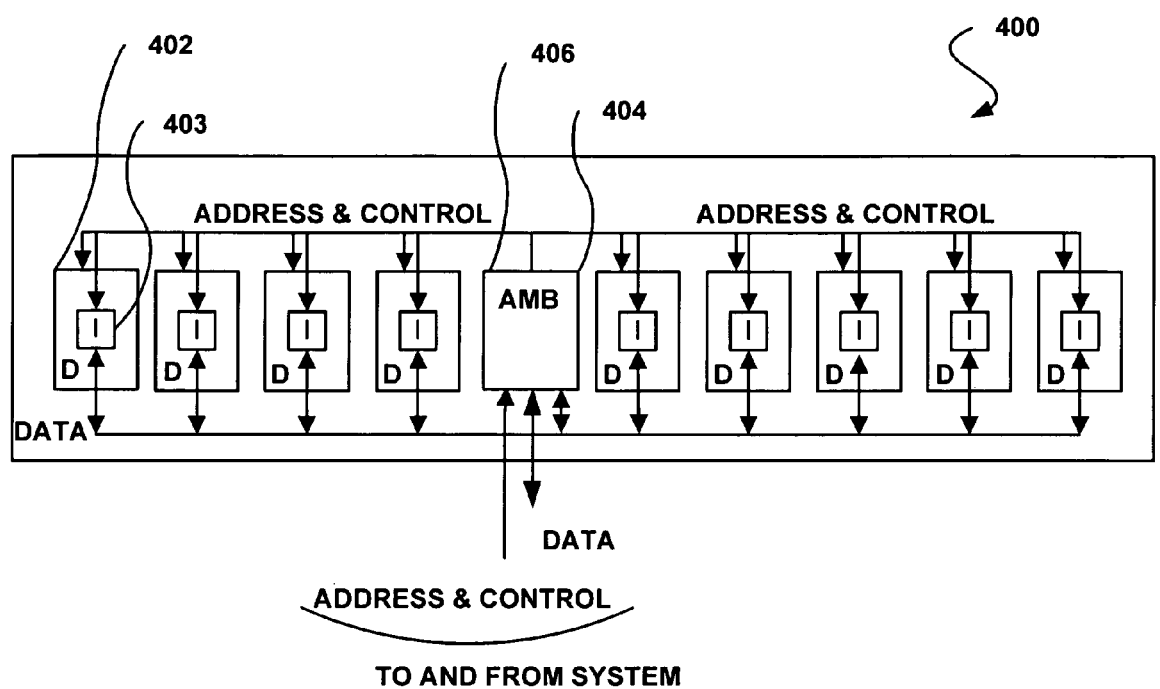

FIG. 4D shows the AMB chip 404 driving address and/or control signals to the DRAM circuits 402 and/or the intelligent interface circuits 403. This figure illustrates that the AMB chip 404 may drive zero, one, or more address and/or control signals to one or more intelligent interface circuits 403. Moreover, each DRAM data bus is connected to the intelligent interface circuits 403 (not shown explicitly). The intelligent interface circuit data bus is connected to the AMB chip 404. The AMB data bus is connected to the system.

Figure 4E:
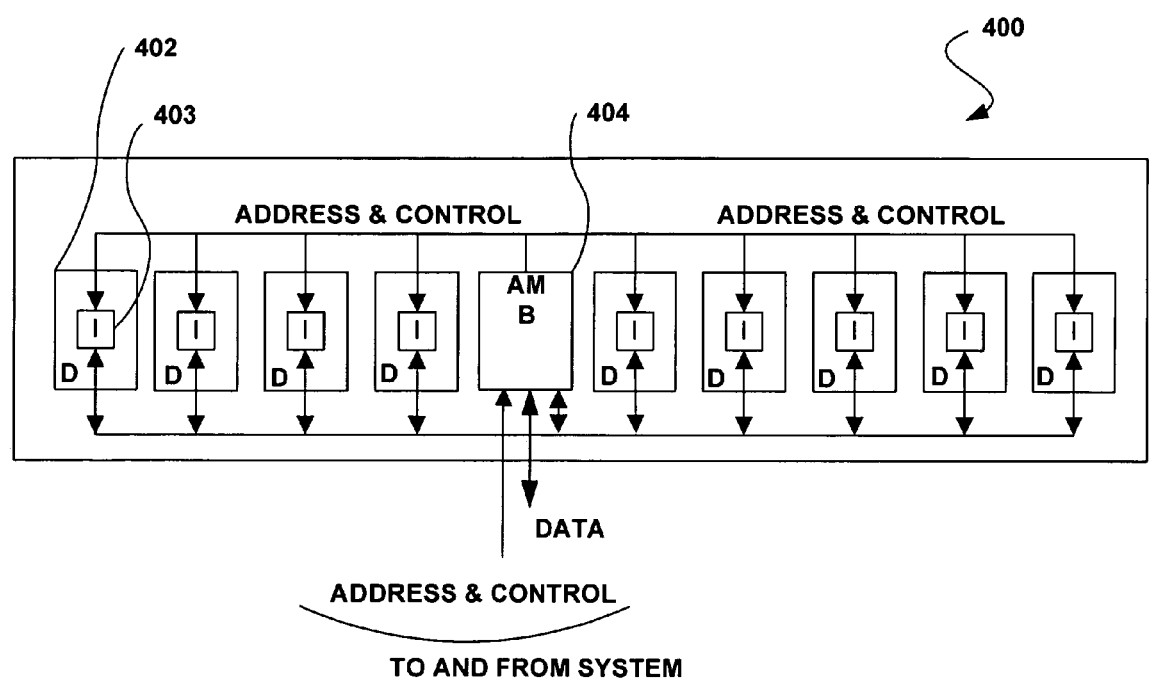

FIG. 4E shows the AMB chip 404 driving address and control to one or more intelligent interface circuits 403. The intelligent interface circuits 403 then drive address and control to each DRAM circuit 402 (not shown explicitly). Moreover, each DRAM data bus is connected to the intelligent interface circuits 403 (also not shown explicitly). The intelligent interface circuit data bus is connected to the AMB chip 404. The AMB data bus is connected to the system.

In other embodiments, combinations of the above implementations as shown in FIGS. 4A-E may be utilized. Just by way of example, one or more register chips may be utilized in conjunction with the intelligent interface circuits. In other embodiments, register chips may be utilized alone and/or with or without stacks of DRAM circuits.

Figure 5:
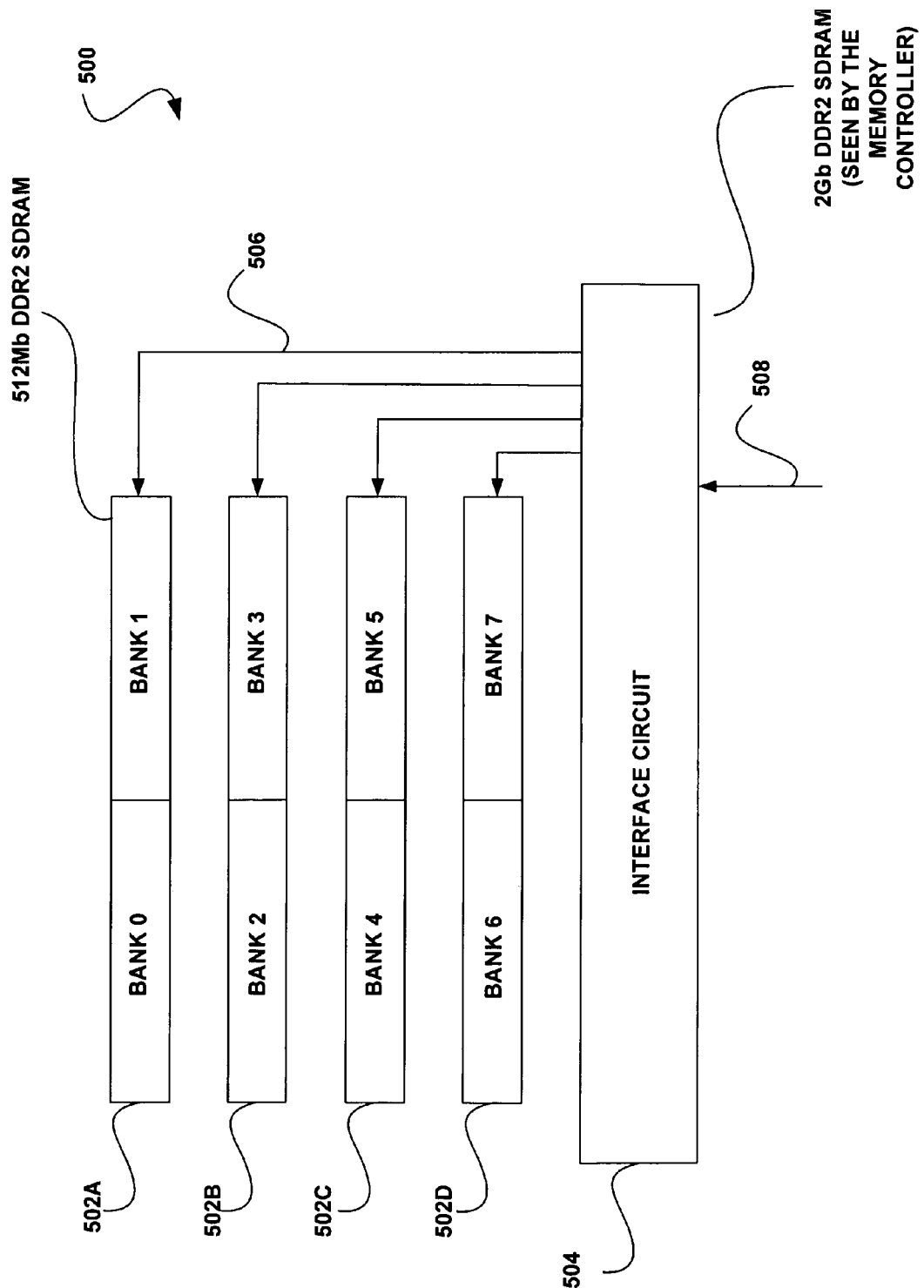
FIG. 5 shows a system in which four 512 Mb DRAM circuits are mapped to a single 2 Gb DRAM circuit, in accordance with yet another embodiment.

FIG. 5 shows a system 500 in which four 512 Mb DRAM circuits appear, through simulation, as (e.g. mapped to) a single 2 Gb virtual DRAM circuit, in accordance with yet another embodiment. As an option, the system 500 may be implemented in the context of the architecture and environment of FIGS. 1-4. Of course, however, the system 500 may be implemented in any desired environment. It should also be noted that the aforementioned definitions may apply during the present description.

As shown in FIG. 5, a stack of memory circuits that is interfaced by the interface circuit for the purpose of simulation (e.g. a buffered stack) may include four 512 Mb physical DRAM circuits 502A-D that appear to a memory controller as a single 2 Gb virtual DRAM circuit. In different embodiments, the buffered stack may include various numbers of physical DRAM circuits including two, four, eight, sixteen or even more physical DRAM circuits that appear to the memory controller as a single larger capacity virtual DRAM circuit or multiple larger capacity virtual DRAM circuits. In addition, the number of physical DRAM circuits in the buffered stack may be an odd number. For example, an odd number of circuits may be used to provide data redundancy or data checking or other features.

Also, one or more control signals (e.g. power management signals) 506 may be connected between the interface circuit 504 and the DRAM circuits 502A-D in the stack. The interface circuit 504 may be connected to a control signal (e.g. power management signal) 508 from the system, where the system uses the control signal 508 to control one aspect (e.g. power behavior) of the 2 Gb virtual DRAM circuit in the stack. The interface circuit 504 may control the one aspect (e.g. power behavior) of all the DRAM circuits 502A-D in response to a control signal 508 from the system to the 2 Gb virtual DRAM circuit. The interface circuit 504 may also, using control signals 506, control the one aspect (e.g. power behavior) of one or more of the DRAM circuits 502A-D in the stack in the absence of a control signal 508 from the system to the 2 Gb virtual DRAM circuit.

The buffered stacks 500 may also be used in combination together on a DIMM such that the DIMM appears to the memory controller as a larger capacity DIMM. The buffered stacks may be arranged in one or more ranks on the DIMM. All the virtual DRAM circuits on the DIMM that respond in parallel to a control signal 508 (e.g. chip select signal, clock enable signal, etc.) from the memory controller belong to a single rank. However, the interface circuit 504 may use a plurality of control signals 506 instead of control signal 508 to control DRAM circuits 502A-D. The interface circuit 504 may use all the control signals 506 in parallel in response to the control signal 508 to do power management of the DRAM circuits 502A-D in one example. In another example, the interface circuit 504 may use at least one but not all the control signals 506 in response to the control signal 508 to do power management of the DRAM circuits 502A-D. In yet another example, the interface circuit 504 may use at least one control signal 506 in the absence of the control signal 508 to do power management of the DRAM circuits 502A-D.

More information regarding the verification that a memory module including DRAM circuits with various interface circuits behave according to a desired DRAM standard or other design specification will be set forth hereinafter in greater detail.

Dram Bank Configuration Embodiments

The number of banks per DRAM circuit may be defined by JEDEC standards for many DRAM circuit technologies. In various embodiments, there may be different configurations that use different mappings between the physical DRAM circuits in a stack and the banks in each virtual DRAM circuit seen by the memory controller. In each configuration, multiple physical DRAM circuits 502A-D may be stacked and interfaced by an interface circuit 504 and may appear as at least one larger capacity virtual DRAM circuit to the memory controller. Just by way of example, the stack may include four 512 Mb DDR2 physical SDRAM circuits that appear to the memory controller as a single 2 Gb virtual DDR2 SDRAM circuit.

In one optional embodiment, each bank of a virtual DRAM circuit seen by the memory controller may correspond to a portion of a physical DRAM circuit. That is, each physical DRAM circuit may be mapped to multiple banks of a virtual DRAM circuit. For example, in one embodiment, four 512 Mb DDR2 physical SDRAM circuits through simulation may appear to the memory controller as a single 2 Gb virtual DDR2 SDRAM circuit. A 2 Gb DDR2 SDRAM may have eight banks as specified by the JEDEC standards. Therefore, in this embodiment, the interface circuit 504 may map each 512 Mb physical DRAM circuit to two banks of the 2 Gb virtual DRAM. Thus, in the context of the present embodiment, a one-circuit-to-many-bank configuration (one physical DRAM circuit to many banks of a virtual DRAM circuit) may be utilized.

In another embodiment, each physical DRAM circuit may be mapped to a single bank of a virtual DRAM circuit. For example, eight 512 Mb DDR2 physical SDRAM circuits may appear to the memory controller, through simulation, as a single 4 Gb virtual DDR2 SDRAM circuit. A 4 Gb DDR2 SDRAM may have eight banks as specified by the JEDEC standards. Therefore, the interface circuit 504 may map each 512 Mb physical DRAM circuit to a single bank of the 4 Gb virtual DRAM. In this way, a one-circuit-to-one-bank configuration (one physical DRAM circuit to one bank of a virtual DRAM circuit) may be utilized.

In yet another embodiment, a plurality of physical DRAM circuits may be mapped to a single bank of a virtual DRAM circuit. For example, sixteen 256 Mb DDR2 physical SDRAM circuits may appear to the memory controller, through simulation, as a single 4 Gb virtual DDR2 SDRAM circuit. A 4 Gb DDR2 SDRAM circuit may be specified by JEDEC to have eight banks, such that each bank of the 4 Gb DDR2 SDRAM circuit may be 512 Mb. Thus, two of the 256 Mb DDR2 physical SDRAM circuits may be mapped by the interface circuit 504 to a single bank of the 4 Gb virtual DDR2 SDRAM circuit seen by the memory controller. Accordingly, a many-circuit-to-one-bank configuration (many physical DRAM circuits to one bank of a virtual DRAM circuit) may be utilized.

Thus, in the above described embodiments, multiple physical DRAM circuits 502A-D in the stack may be buffered by the interface circuit 504 and may appear as at least one larger capacity virtual DRAM circuit to the memory controller. Just by way of example, the buffered stack may include four 512 Mb DDR2 physical SDRAM circuits that appear to the memory controller as a single 2 Gb DDR2 virtual SDRAM circuit. In normal operation, the combined power dissipation of all four DRAM circuits 502A-D in the stack when they are active may be higher than the power dissipation of a monolithic (e.g. constructed without stacks) 2 Gb DDR2 SDRAM.

In general, the power dissipation of a DIMM constructed from buffered stacks may be much higher than a DIMM constructed without buffered stacks. Thus, for example, a DIMM containing multiple buffered stacks may dissipate much more power than a standard DIMM built using monolithic DRAM circuits. However, power management may be utilized to reduce the power dissipation of DIMMs that contain buffered stacks of DRAM circuits. Although the examples described herein focus on power management of buffered stacks of DRAM circuits, techniques and methods described apply equally well to DIMMs that are constructed without stacking the DRAM circuits (e.g. a stack of one DRAM circuit) as well as stacks that may not require buffering.

Embodiments Involving Dram Power Management Latencies

In various embodiments, power management schemes may be utilized for one-circuit-to-many-bank, one-circuit-to-one-bank, and many-circuit-to-one-bank configurations. Memory (e.g. DRAM) circuits may provide external control inputs for power management. In DDR2 SDRAM, for example, power management may be initiated using the CKE and chip select (CS#) inputs and optionally in combination with a command to place the DDR2 SDRAM in various power down modes.

Four power saving modes for DDR2 SDRAM may be utilized, in accordance with various different embodiments (or even in combination, in other embodiments). In particular, two active power down modes, precharge power down mode, and self-refresh mode may be utilized. If CKE is de-asserted while CS# is asserted, the DDR2 SDRAM may enter an active or precharge power down mode. If CKE is de-asserted while CS# is asserted in combination with the refresh command, the DDR2 SDRAM may enter the self refresh mode.

If power down occurs when there are no rows active in any bank, the DDR2 SDRAM may enter precharge power down mode. If power down occurs when there is a row active in any bank, the DDR2 SDRAM may enter one of the two active power down modes. The two active power down modes may include fast exit active power down mode or slow exit active power down mode.

The selection of fast exit mode or slow exit mode may be determined by the configuration of a mode register. The maximum duration for either the active power down mode or the precharge power down mode may be limited by the refresh requirements of the DDR2 SDRAM and may further be equal to tRFC(MAX).

DDR2 SDRAMs may require CKE to remain stable for a minimum time of tCKE(MIN). DDR2 SDRAMs may also require a minimum time of tXP(MIN) between exiting precharge power down mode or active power down mode and a subsequent non-read command. Furthermore, DDR2 SDRAMs may also require a minimum time of tXARD (MIN) between exiting active power down mode (e.g. fast exit) and a subsequent read command. Similarly, DDR2 SDRAMs may require a minimum time of tXARDS(MIN) between exiting active power down mode (e.g. slow exit) and a subsequent read command.

Just by way of example, power management for a DDR2 SDRAM may require that the SDRAM remain in a power down mode for a minimum of three clock cycles [e.g. tCKE(MIN)=3 clocks]. Thus, the SDRAM may require a power down entry latency of three clock cycles.

Also as an example, a DDR2 SDRAM may also require a minimum of two clock cycles between exiting a power down mode and a subsequent command [e.g. tXP(MIN)=2 clock cycles; tXARD(MIN)=2 clock cycles]. Thus, the SDRAM may require a power down exit latency of two clock cycles.

Of course, for other DRAM or memory technologies, the power down entry latency and power down exit latency may be different, but this does not necessarily affect the operation of power management described here.

Accordingly, in the case of DDR2 SDRAM, a minimum total of five clock cycles may be required to enter and then immediately exit a power down mode (e.g. three cycles to satisfy tCKE(min) due to entry latency plus two cycles to satisfy tXP(MIN) or tXARD(MIN) due to exit latency). These five clock cycles may be hidden from the memory controller if power management is not being performed by the controller itself. Of course, it should be noted that other restrictions on the timing of entry and exit from the various power down modes may exist.

In one exemplary embodiment, the minimum power down entry latency for a DRAM circuit may be n clocks. In addition, in the case of DDR2, n=3, three cycles may be required to satisfy tCKE(MIN). Also, the minimum power down exit latency of a DRAM circuit may be x clocks. In the case of DDR2, x=2, two cycles may be required to satisfy tXP(MIN) and tXARD(MIN). Thus, the power management latency of a DRAM circuit in the present exemplary embodiment may require a minimum of k=n+x clocks for the DRAM circuit to enter power down mode and exit from power down mode. (e.g. DDR2, k=3+2=5 clock cycles).

Dram Command Operation Period Embodiments

DRAM operations such as precharge or activate may require a certain period of time to complete. During this time, the DRAM, or portion(s) thereof (e.g. bank, etc.) to which the operation is directed may be unable to perform another operation. For example, a precharge operation in a bank of a DRAM circuit may require a certain period of time to complete (specified as tRP for DDR2).

During tRP and after a precharge operation has been initiated, the memory controller may not necessarily be allowed to direct another operation (e.g. activate, etc.) to the same bank of the DRAM circuit. The period of time between the initiation of an operation and the completion of that operation may thus be a command operation period. Thus, the memory controller may not necessarily be allowed to direct another operation to a particular DRAM circuit or portion thereof during a command operation period of various commands or operations. For example, the command operation period of a precharge operation or command may be equal to tRP. As another example, the command operation period of an activate command may be equal to tRCD.

In general, the command operation period need not be limited to a single command. A command operation period can also be defined for a sequence, combination, or pattern of commands. The power management schemes described herein thus need not be limited to a single command and associated command operation period; the schemes may equally be applied to sequences, patterns, and combinations of commands. It should also be noted that a command may have a first command operation period in a DRAM circuit to which the command is directed to, and also have a second command operation period in another DRAM circuit to which the command is not directed to. The first and second command operation periods need not be the same. In addition, a command may have different command operation periods in different mappings of physical DRAM circuits to the banks of a virtual DRAM circuit, and also under different conditions.

It should be noted that the command operation periods may be specified in nanoseconds. For example, tRP may be specified in nanoseconds, and may vary according to the speed grade of a DRAM circuit. Furthermore, tRP may be defined in JEDEC standards (e.g. currently JEDEC Standard No. 21-C for DDR2 SDRAM). Thus, tRP may be measured as an integer number of clock cycles. Optionally, the tRP may not necessarily be specified to be an exact number clock cycles. For DDR2 SDRAMs, the minimum value of tRP may be equivalent to three clock cycles or more.

In additional exemplary embodiments, power management schemes may be based on an interface circuit identifying at least one memory (e.g. DRAM, etc.) circuit that is not currently being accessed by the system. In response to the identification of the at least one memory circuit, a power saving operation may be initiated in association with the at least one memory circuit.

In one embodiment, such power saving operation may involve a power down operation, and in particular, a precharge power down operation, using the CKE pin of the DRAM circuits (e.g. a CKE power management scheme). Other similar power management schemes using other power down control methods and power down modes, with different commands and alternative memory circuit technologies, may also be used.

If the CKE power-management scheme does not involve the memory controller, then the presence of the scheme may be transparent to the memory controller. Accordingly, the power down entry latency and the power down exit latency may be hidden from the memory controller. In one embodiment, the power down entry and exit latencies may be hidden from the memory controller by opportunistically placing at least one first DRAM circuit into a power down mode and, if required, bringing at least one second DRAM circuit out of power down mode during a command operation period when the at least one first DRAM circuit is not being accessed by the system.

The identification of the appropriate command operation period during which at least one first DRAM circuit in a stack may be placed in power down mode or brought out of power down mode may be based on commands directed to the first DRAM circuit (e.g. based on commands directed to itself) or on commands directed to a second DRAM circuit (e.g. based on commands directed to other DRAM circuits).

In another embodiment, the command operation period of the DRAM circuit may be used to hide the power down entry and/or exit latencies. For example, the existing command operation periods of the physical DRAM circuits may be used to the hide the power down entry and/or exit latencies if the delays associated with one or more operations are long enough to hide the power down entry and/or exit latencies. In yet another embodiment, the command operation period of a virtual DRAM circuit may be used to hide the power down entry and/or exit latencies by making the command operation period of the virtual DRAM circuit longer than the command operation period of the physical DRAM circuits.

Thus, the interface circuit may simulate a plurality of physical DRAM circuits to appear as at least one virtual DRAM circuit with at least one command operation period that is different from that of the physical DRAM circuits. This embodiment may be used if the existing command operation periods of the physical DRAM circuits are not long enough to hide the power down entry and/or exit latencies, thus necessitating the interface circuit to increase the command operation periods by simulating a virtual DRAM circuit with at least one different (e.g. longer, etc.) command operation period from that of the physical DRAM circuits.

Specific examples of different power management schemes in various embodiments are described below for illustrative purposes. It should again be strongly noted that the following information is set forth for illustrative purposes and should not be construed as limiting in any manner.

Row Cycle Time Based Power Management Embodiments

Row cycle time based power management is an example of a power management scheme that uses the command operation period of DRAM circuits to hide power down entry and exit latencies. In one embodiment, the interface circuit may place at least one first physical DRAM circuit into power down mode based on the commands directed to a second physical DRAM circuit. Power management schemes such as a row cycle time based scheme may be best suited for a many-circuit-to-one-bank configuration of DRAM circuits.

As explained previously, in a many-circuit-to-one-bank configuration, a plurality of physical DRAM circuits may be mapped to a single bank of a larger capacity virtual DRAM circuit seen by the memory controller. For example, sixteen 256 Mb DDR2 physical SDRAM circuits may appear to the memory controller as a single 4 Gb virtual DDR2 SDRAM circuit. Since a 4 Gb DDR2 SDRAM circuit is specified by the JEDEC standards to have eight physical banks, two of the 256 Mb DDR2 physical SDRAM circuits may be mapped by the interface circuit to a single bank of the virtual 4 Gb DDR2 SDRAM circuit.

In one embodiment, bank 0 of the virtual 4 Gb DDR2 SDRAM circuit may be mapped by the interface circuit to two 256 Mb DDR2 physical SDRAM circuits (e.g. DRAM A and DRAM B). However, since only one page may be open in a bank of a DRAM circuit (either physical or virtual) at any given time, only one of DRAM A or DRAM B may be in the active state at any given time. If the memory controller issues a first activate (e.g. page open, etc.) command to bank 0 of the 4 Gb virtual DRAM, that command may be directed by the interface circuit to either DRAM A or DRAM B, but not to both.

In addition, the memory controller may be unable to issue a second activate command to bank 0 of the 4 Gb virtual DRAM until a period tRC has elapsed from the time the first activate command was issued by the memory controller. In this instance, the command operation period of an activate command may be tRC. The parameter tRC may be much longer than the power down entry and exit latencies.

Therefore, if the first activate command is directed by the interface circuit to DRAM A, then the interface circuit may place DRAM B in the precharge power down mode during the activate command operation period (e.g. for period tRC). As another option, if the first activate command is directed by the interface circuit to DRAM B, then it may place DRAM A in the precharge power down mode during the command operation period of the first activate command. Thus, if p physical DRAM circuits (where p is greater than 1) are mapped to a single bank of a virtual DRAM circuit, then at least p−1 of the p physical DRAM circuits may be subjected to a power saving operation. The power saving operation may, for example, comprise operating in precharge power down mode except when refresh is required. Of course, power savings may also occur in other embodiments without such continuity.

Row Precharge Time Based Power Management Embodiments

Row precharge time based power management is an example of a power management scheme that, in one embodiment, uses the precharge command operation period (that is the command operation period of precharge commands, tRP) of physical DRAM circuits to hide power down entry and exit latencies. In another embodiment, a row precharge time based power management scheme may be implemented that uses the precharge command operation period of virtual DRAM circuits to hide power down entry and exit latencies. In these schemes, the interface circuit may place at least one DRAM circuit into power down mode based on commands directed to the same at least one DRAM circuit. Power management schemes such as the row precharge time based scheme may be best suited for many-circuit-to-one-bank and one-circuit-to-one-bank configurations of physical DRAM circuits. A row precharge time based power management scheme may be particularly efficient when the memory controller implements a closed page policy.

A row precharge time based power management scheme may power down a physical DRAM circuit after a precharge or autoprecharge command closes an open bank. This power management scheme allows each physical DRAM circuit to enter power down mode when not in use. While the specific memory circuit technology used in this example is DDR2 and the command used here is the precharge or autoprecharge command, the scheme may be utilized in any desired context. This power management scheme uses an algorithm to determine if there is any required delay as well as the timing of the power management in terms of the command operation period.

In one embodiment, if the tRP of a physical DRAM circuit [tRP(physical)] is larger than k (where k is the power management latency), then the interface circuit may place that DRAM circuit into precharge power down mode during the command operation period of the precharge or autoprecharge command. In this embodiment, the precharge power down mode may be initiated following the precharge or autoprecharge command to the open bank in that physical DRAM circuit. Additionally, the physical DRAM circuit may be brought out of precharge power down mode before the earliest time a subsequent activate command may arrive at the inputs of the physical DRAM circuit. Thus, the power down entry and power down exit latencies may be hidden from the memory controller.

In another embodiment, a plurality of physical DRAM circuits may appear to the memory controller as at least one larger capacity virtual DRAM circuit with a tRP(virtual) that is larger than that of the physical DRAM circuits [e.g. larger than tRP(physical)]. For example, the physical DRAM circuits may, through simulation, appear to the memory controller as a larger capacity virtual DRAM with tRP(virtual) equal to tRP(physical)+m, where m may be an integer multiple of the clock cycle, or may be a non-integer multiple of the clock cycle, or may be a constant or variable multiple of the clock cycle, or may be less than one clock cycle, or may be zero. Note that m may or may not be equal to j. If tRP(virtual) is larger than k, then the interface circuit may place a physical DRAM circuit into precharge power down mode in a subsequent clock cycle after a precharge or autoprecharge command to the open bank in the physical DRAM circuit has been received by the physical DRAM circuit. Additionally, the physical DRAM circuit may be brought out of precharge power down mode before the earliest time a subsequent activate command may arrive at the inputs of the physical DRAM circuit. Thus, the power down entry and power down exit latency may be hidden from the memory controller.

In yet another embodiment, the interface circuit may make the stack of physical DRAM circuits appear to the memory controller as at least one larger capacity virtual DRAM circuit with tRP(virtual) and tRCD(virtual) that are larger than that of the physical DRAM circuits in the stack [e.g. larger than tRP(physical) and tRCD(physical) respectively, where tRCD(physical) is the tRCD of the physical DRAM circuits]. For example, the stack of physical DRAM circuits may appear to the memory controller as a larger capacity virtual DRAM with tRP(virtual) and tRCD(virtual) equal to [tRP(physical)+m] and tRCD(physical)+l] respectively. Similar to m, l may be an integer multiple of the clock cycle, or may be a non-integer multiple of the clock cycle, or may be constant or variable multiple of the clock cycle, or may be less than a clock cycle, or may be zero. Also, l may or may not be equal to j and/or m. In this embodiment, if tRP(virtual) is larger than n (where n is the power down entry latency defined earlier), and if l is larger than or equal to x (where x is the power down exit latency defined earlier), then the interface circuit may use the following sequence of events to implement a row precharge time based power management scheme and also hide the power down entry and exit latencies from the memory controller.

First, when a precharge or autoprecharge command is issued to an open bank in a physical DRAM circuit, the interface circuit may place that physical DRAM circuit into precharge power down mode in a subsequent clock cycle after the precharge or autoprecharge command has been received by that physical DRAM circuit. The interface circuit may continue to keep the physical DRAM circuit in the precharge power down mode until the interface circuit receives a subsequent activate command to that physical DRAM circuit.

Second, the interface circuit may then bring the physical DRAM circuit out of precharge power down mode by asserting the CKE input of the physical DRAM in a following clock cycle. The interface circuit may also delay the address and control signals associated with the activate command for a minimum of x clock cycles before sending the signals associated with the activate command to the physical DRAM circuit.

The row precharge time based power management scheme described above is suitable for many-circuit-to-one-bank and one-circuit-to-one-bank configurations since there is a guaranteed minimum period of time (e.g. a keep-out period) of at least tRP(physical) after a precharge command to a physical DRAM circuit during which the memory controller will not issue a subsequent activate command to the same physical DRAM circuit. In other words, the command operation period of a precharge command applies to the entire DRAM circuit. In the case of one-circuit-to-many-bank configurations, there is no guarantee that a precharge command to a first portion(s) (e.g. bank) of a physical DRAM circuit will not be immediately followed by an activate command to a second portion(s) (e.g. bank) of the same physical DRAM circuit. In this case, there is no keep-out period to hide the power down entry and exit latencies. In other words, the command operation period of a precharge command applies only to a portion of the physical DRAM circuit.

For example, four 512 Mb physical DDR2 SDRAM circuits through simulation may appear to the memory controller as a single 2 Gb virtual DDR2 SDRAM circuit with eight banks. Therefore, the interface circuit may map two banks of the 2 Gb virtual DRAM circuit to each 512 Mb physical DRAM circuit. Thus, banks 0 and 1 of the 2 Gb virtual DRAM circuit may be mapped to a single 512 Mb physical DRAM circuit (e.g. DRAM C). In addition, bank 0 of the virtual DRAM circuit may have an open page while bank 1 of the virtual DRAM circuit may have no open page.

When the memory controller issues a precharge or auto-precharge command to bank 0 of the 2 Gb virtual DRAM circuit, the interface circuit may signal DRAM C to enter the precharge power down mode after the precharge or auto-precharge command has been received by DRAM C. The interface circuit may accomplish this by de-asserting the CKE input of DRAM C during a clock cycle subsequent to the clock cycle in which DRAM C received the precharge or autoprecharge command. However, the memory controller may issue an activate command to the bank 1 of the 2 Gb virtual DRAM circuit on the next clock cycle after it issued the precharge command to bank 0 of the virtual DRAM circuit.

However, DRAM C may have just entered a power down mode and may need to exit power down immediately. As described above, a DDR2 SDRAM may require a minimum of k=5 clock cycles to enter a power down mode and immediately exit the power down mode. In this example, the command operation period of the precharge command to bank 0 of the 2 Gb virtual DRAM circuit may not be sufficiently long enough to hide the power down entry latency of DRAM C even if the command operation period of the activate command to bank 1 of the 2 Gb virtual DRAM circuit is long enough to hide the power down exit latency of DRAM C, which would then cause the simulated 2 Gb virtual DRAM circuit to not be in compliance with the DDR2 protocol. It is therefore difficult, in a simple fashion, to hide the power management latency during the command operation period of precharge commands in a one-circuit-to-many-bank configuration.

Row Activate Time Based Power Management Embodiments

Row activate time based power management is a power management scheme that, in one embodiment, may use the activate command operation period (that is the command operation period of activate commands) of DRAM circuits to hide power down entry latency and power down exit latency.

In a first embodiment, a row activate time based power management scheme may be used for one-circuit-to-many-bank configurations. In this embodiment, the power down entry latency of a physical DRAM circuit may be hidden behind the command operation period of an activate command directed to a different physical DRAM circuit. Additionally, the power down exit latency of a physical DRAM circuit may be hidden behind the command operation period of an activate command directed to itself. The activate command operation periods that are used to hide power down entry and exit latencies may be tRRD and tRCD respectively.

In a second embodiment, a row activate time based power management scheme may be used for many-circuit-to-one-bank and one-circuit-to-one-bank configurations. In this embodiment, the power down entry and exit latencies of a physical DRAM circuit may be hidden behind the command operation period of an activate command directed to itself. In this embodiment, the command operation period of an activate command may be tRCD.

In the first embodiment, a row activate time based power management scheme may place a first DRAM circuit that has no open banks into a power down mode when an activate command is issued to a second DRAM circuit if the first and second DRAM circuits are part of a plurality of physical DRAM circuits that appear as a single virtual DRAM circuit to the memory controller. This power management scheme may allow each DRAM circuit to enter power down mode when not in use. This embodiment may be used in one-circuit-to-many-bank configurations of DRAM circuits. While the specific memory circuit technology used in this example is DDR2 and the command used here is the activate command, the scheme may be utilized in any desired context. The scheme uses an algorithm to determine if there is any required delay as well as the timing of the power management in terms of the command operation period.

In a one-circuit-to-many-bank configuration, a plurality of banks of a virtual DRAM circuit may be mapped to a single physical DRAM circuit. For example, four 512 Mb DDR2 SDRAM circuits through simulation may appear to the memory controller as a single 2 Gb virtual DDR2 SDRAM circuit with eight banks. Therefore, the interface circuit may map two banks of the 2 Gb virtual DRAM circuit to each 512 Mb physical DRAM circuit. Thus, banks 0 and 1 of the 2 Gb virtual DRAM circuit may be mapped to a first 512 Mb physical DRAM circuit (e.g. DRAM P). Similarly, banks 2 and 3 of the 2 Gb virtual DRAM circuit may be mapped to a second 512 Mb physical DRAM circuit (e.g. DRAM Q), banks 4 and 5 of the 2 Gb virtual DRAM circuit may be mapped to a third 512 Mb physical DRAM circuit (e.g. DRAM R), and banks 6 and 7 of the 2 Gb virtual DRAM circuit may be mapped to a fourth 512 Mb physical DRAM circuit (e.g. DRAM S).

In addition, bank 0 of the virtual DRAM circuit may have an open page while all the other banks of the virtual DRAM circuit may have no open pages. When the memory controller issues a precharge or autoprecharge command to bank 0 of the 2 Gb virtual DRAM circuit, the interface circuit may not be able to place DRAM P in precharge power down mode after the precharge or autoprecharge command has been received by DRAM P. This may be because the memory controller may issue an activate command to bank 1 of the 2 Gb virtual DRAM circuit in the very next cycle. As described previously, a row precharge time based power management scheme may not be used in a one-circuit-to-many-bank configuration since there is no guaranteed keep-out period after a precharge or autoprecharge command to a physical DRAM circuit.

However, since physical DRAM circuits DRAM P, DRAM Q, DRAM R, and DRAM S all appear to the memory controller as a single 2 Gb virtual DRAM circuit, the memory controller may ensure a minimum period of time, tRRD(MIN), between activate commands to the single 2 Gb virtual DRAM circuit. For DDR2 SDRAMs, the active bank N to active bank M command period tRRD may be variable with a minimum value of tRRD(MIN) (e.g. 2 clock cycles, etc.).

The parameter tRRD may be specified in nanoseconds and may be defined in JEDEC Standard No. 21-C. For example, tRRD may be measured as an integer number of clock cycles. Optionally, tRRD may not be specified to be an exact number of clock cycles. The tRRD parameter may mean an activate command to a second bank B of a DRAM circuit (either physical DRAM circuit or virtual DRAM circuit) may not be able to follow an activate command to a first bank A of the same DRAM circuit in less than tRRD clock cycles.

If tRRD(MIN)=n (where n is the power down entry latency), a first number of physical DRAM circuits that have no open pages may be placed in power down mode when an activate command is issued to another physical DRAM circuit that through simulation is part of the same virtual DRAM circuit. In the above example, after a precharge or autoprecharge command has closed the last open page in DRAM P, the interface circuit may keep DRAM P in precharge standby mode until the memory controller issues an activate command to one of DRAM Q, DRAM R, and DRAM S. When the interface circuit receives the above-mentioned activate command, it may then immediately place DRAM P into precharge power down mode if tRRD (MIN)≧n.

Optionally, when one of the interface circuits is a register, the above power management scheme may be used even if tRRD(MIN)<n as long as tRRD(MIN)=n−1. In this optional embodiment, the additional typical one clock cycle delay through a JEDEC register helps to hide the power down entry latency if tRRD(MIN) by itself is not sufficiently long to hide the power down entry latency.

The above embodiments of a row activate time power management scheme require l to be larger than or equal to x (where x is the power down exit latency) so that when the memory controller issues an activate command to a bank of the virtual DRAM circuit, and if the corresponding physical DRAM circuit is in precharge power down mode, the interface circuit can hide the power down exit latency of the physical DRAM circuit behind the row activate time tRCD of the virtual DRAM circuit. The power down exit latency may be hidden because the interface circuit may simulate a plurality of physical DRAM circuits as a larger capacity virtual DRAM circuit with tRCD(virtual)=tRCD(physical)+l, where tRCD(physical) is the tRCD of the physical DRAM circuits.

Therefore, when the interface circuit receives an activate command that is directed to a DRAM circuit that is in precharge power down mode, it will delay the activate command by at least x clock cycles while simultaneously bringing the DRAM circuit out of power down mode. Since l≧x, the command operation period of the activate command may overlap the power down exit latency, thus allowing the interface circuit to hide the power down exit latency behind the row activate time.

Using the same example as above, DRAM P may be placed into precharge power down mode after the memory controller issued a precharge or autoprecharge command to the last open page in DRAM P and then issued an activate command to one of DRAM Q, DRAM R, and DRAM S. At a later time, when the memory controller issues an activate command to DRAM P, the interface circuit may immediately bring DRAM P out of precharge power down mode while delaying the activate command to DRAM P by at least x clock cycles. Since l≧x, DRAM P may be ready to receive the delayed activate command when the interface circuit sends the activate command to DRAM P.

For many-circuit-to-one-bank and one-circuit-to-one-bank configurations, another embodiment of the row activate time based power management scheme may be used. For both many-circuit-to-one-bank and one-circuit-to-one-bank configurations, an activate command to a physical DRAM circuit may have a keep-out or command operation period of at least tRCD(virtual) clock cycles [tRCD(virtual) =tRCD(physical)+l]. Since each physical DRAM circuit is mapped to one bank (or portion(s) thereof) of a larger capacity virtual DRAM circuit, it may be certain that no command may be issued to a physical DRAM circuit for a minimum of tRCD(virtual) clock cycles after an activate command has been issued to the physical DRAM circuit.

If tRCD(physical) or tRCD(virtual) is larger than k (where k is the power management latency), then the interface circuit may place the physical DRAM circuit into active power down mode on the clock cycle after the activate command has been received by the physical DRAM circuit and bring the physical DRAM circuit out of active power down mode before the earliest time a subsequent read or write command may arrive at the inputs of the physical DRAM circuit. Thus, the power down entry and power down exit latencies may be hidden from the memory controller.

The command and power down mode used for the activate command based power-management scheme may be the activate command and precharge or active power down modes, but other similar power down schemes may use different power down modes, with different commands, and indeed even alternative DRAM circuit technologies may be used.

Refresh Cycle Time Based Power Management Embodiments

Refresh cycle time based power management is a power management scheme that uses the refresh command operation period (that is the command operation period of refresh commands) of virtual DRAM circuits to hide power down entry and exit latencies. In this scheme, the interface circuit places at least one physical DRAM circuit into power down mode based on commands directed to a different physical DRAM circuit. A refresh cycle time based power management scheme that uses the command operation period of virtual DRAM circuits may be used for many-circuit-to-one-bank, one-circuit-to-one-bank, and one-circuit-to-many-bank configurations.

Refresh commands to a DRAM circuit may have a command operation period that is specified by the refresh cycle time, tRFC. The minimum and maximum values of the refresh cycle time, tRFC, may be specified in nanoseconds and may further be defined in the JEDEC standards (e.g. JEDEC Standard No. 21-C for DDR2 SDRAM, etc.). In one embodiment, the minimum value of tRFC [e.g. tRFC(MIN)] may vary as a function of the capacity of the DRAM circuit. Larger capacity DRAM circuits may have larger values of tRFC(MIN) than smaller capacity DRAM circuits. The parameter tRFC may be measured as an integer number of clock cycles, although optionally the tRFC may not be specified to be an exact number clock cycles.

A memory controller may initiate refresh operations by issuing refresh control signals to the DRAM circuits with sufficient frequency to prevent any loss of data in the DRAM circuits. After a refresh command is issued to a DRAM circuit, a minimum time (e.g. denoted by tRFC) may be required to elapse before another command may be issued to that DRAM circuit. In the case where a plurality of physical DRAM circuits through simulation by an interface circuit may appear to the memory controller as at least one larger capacity virtual DRAM circuit, the command operation period of the refresh commands (e.g. the refresh cycle time, tRFC) from the memory controller may be larger than that required by the DRAM circuits. In other words, tRFC (virtual)>tRFC(physical), where tRFC(physical) is the refresh cycle time of the smaller capacity physical DRAM circuits.

When the interface circuit receives a refresh command from the memory controller, it may refresh the smaller capacity physical DRAM circuits within the span of time specified by the tRFC associated with the larger capacity virtual DRAM circuit. Since the tRFC of the virtual DRAM circuit may be larger than that of the associated physical DRAM circuits, it may not be necessary to issue refresh commands to all of the physical DRAM circuits simultaneously. Refresh commands may be issued separately to individual physical DRAM circuits or may be issued to groups of physical DRAM circuits, provided that the tRFC requirement of the physical DRAM circuits is satisfied by the time the tRFC of the virtual DRAM circuit has elapsed.

In one exemplary embodiment, the interface circuit may place a physical DRAM circuit into power down mode for some period of the tRFC of the virtual DRAM circuit when other physical DRAM circuits are being refreshed. For example, four 512 Mb physical DRAM circuits (e.g. DRAM W, DRAM X, DRAM Y, DRAM Z) through simulation by an interface circuit may appear to the memory controller as a 2 Gb virtual DRAM circuit. When the memory controller issues a refresh command to the 2 Gb virtual DRAM circuit, it may not issue another command to the 2 Gb virtual DRAM circuit at least until a period of time, tRFC(MIN)(virtual), has elapsed.

Since the tRFC(MIN)(physical) of the 512 Mb physical DRAM circuits (DRAM W, DRAM X, DRAM Y, and DRAM Z) may be smaller than the tRFC(MIN)(virtual) of the 2 Gb virtual DRAM circuit, the interface circuit may stagger the refresh commands to DRAM W, DRAM X, DRAM Y, DRAM Z such that that total time needed to refresh all the four physical DRAM circuits is less than or equal to the tRFC(MIN)(virtual) of the virtual DRAM circuit. In addition, the interface circuit may place each of the physical DRAM circuits into precharge power down mode either before or after the respective refresh operations.

For example, the interface circuit may place DRAM Y and DRAM Z into power down mode while issuing refresh commands to DRAM W and DRAM X. At some later time, the interface circuit may bring DRAM Y and DRAM Z out of power down mode and issue refresh commands to both of them. At a still later time, when DRAM W and DRAM X have finished their refresh operation, the interface circuit may place both of them in a power down mode. At a still later time, the interface circuit may optionally bring DRAM W and DRAM X out of power down mode such that when DRAM Y and DRAM Z have finished their refresh operations, all four DRAM circuits are in the precharge standby state and ready to receive the next command from the memory controller. In another example, the memory controller may place DRAM W, DRAM X, DRAM Y, and DRAM Z into precharge power down mode after the respective refresh operations if the power down exit latency of the DRAM circuits may be hidden behind the command operation period of the activate command of the virtual 2 Gb DRAM circuit.

FB-DIMM Power Management Embodiments

Figure 6:
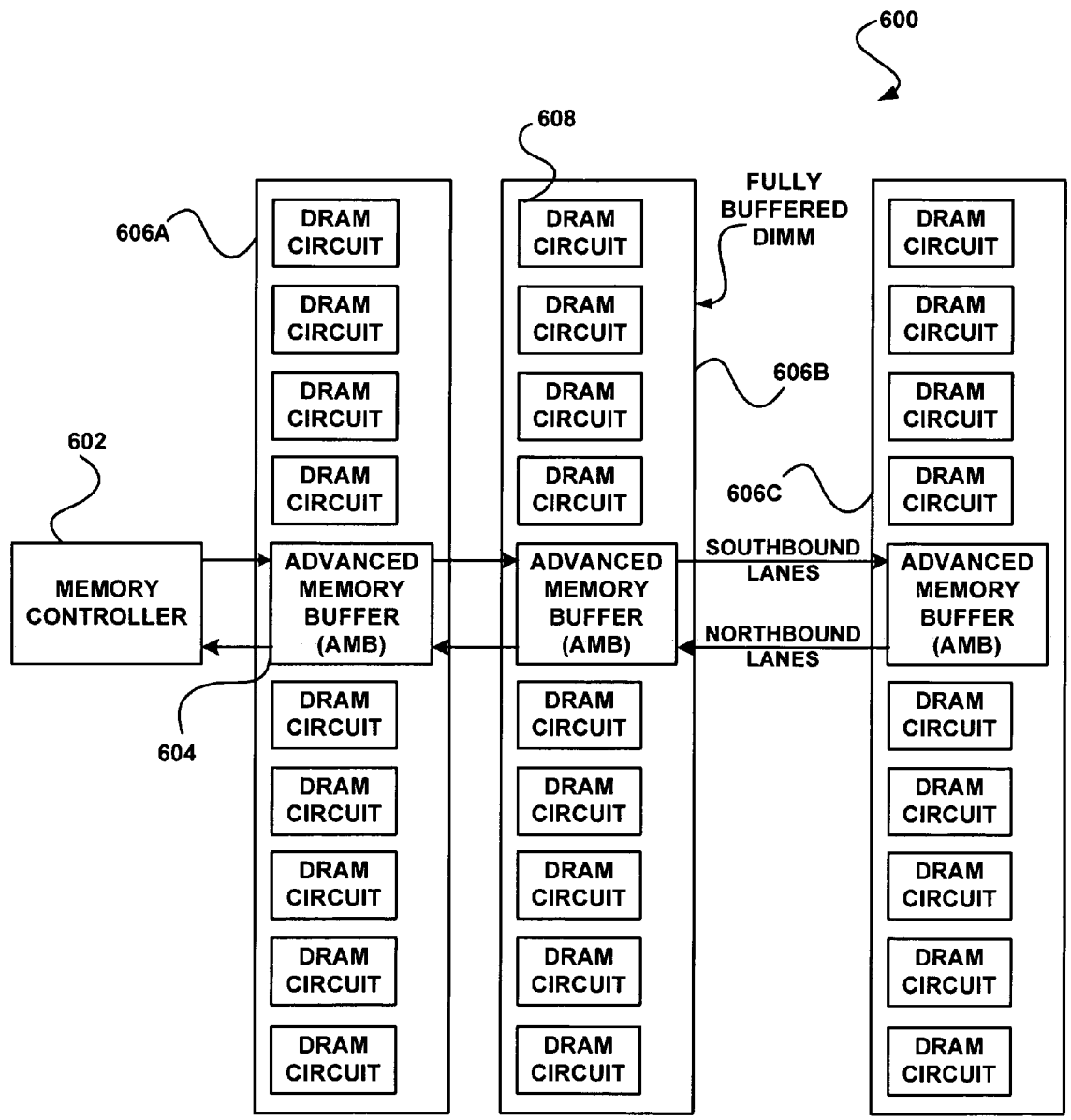
FIG. 6 shows a memory system comprising FB-DIMM modules using DRAM circuits with AMB chips, in accordance with another embodiment.

FIG. 6 shows a memory system 600 comprising FB-DIMM modules using DRAM circuits with AMB chips, in accordance with another embodiment. As an option, the memory system 600 may be implemented in the context of the architecture and environment of FIGS. 1-5. Of course, however, the memory system 600 may be implemented in any desired environment. It should also be noted that the aforementioned definitions may apply during the present description.

As described herein, the memory circuit power management scheme may be associated with an FB-DIMM memory system that uses DDR2 SDRAM circuits. However, other memory circuit technologies such as DDR3 SDRAM, Mobile DDR SDRAM, etc. may provide similar control inputs and modes for power management and the example described in this section can be used with other types of buffering schemes and other memory circuit technologies. Therefore, the description of the specific example should not be construed as limiting in any manner.

In an FB-DIMM memory system 600, a memory controller 602 may place commands and write data into frames and send the frames to interface circuits (e.g. AMB chip 604, etc.). Further, in the FB-DIMM memory system 600, there may be one AMB chip 604 on each of a plurality of DIMMs 606A-C. For the memory controller 602 to address and control DRAM circuits, it may issue commands that are placed into frames.

The command frames or command and data frames may then be sent by the memory controller 602 to the nearest AMB chip 604 through a dedicated outbound path, which may be denoted as a southbound lane. The AMB chip 604 closest to the memory controller 602 may then relay the frames to the next AMB chip 604 via its own southbound lane. In this manner, the frames may be relayed to each AMB chip 604 in the FB-DIMM memory channel.

In the process of relaying the frames, each AMB chip 604 may partially decode the frames to determine if a given frame contains commands targeted to the DRAM circuits on that the associated DIMM 606A-C. If a frame contains a read command addressed to a set of DRAM circuits on a given DIMM 606A-C, the AMB chip 604 on the associated DIMM 606A-C accesses DRAM circuits 608 to retrieve the requested data. The data may be placed into frames and returned to the memory controller 602 through a similar frame relay process on the northbound lanes as that described for the southbound lanes.

Two classes of scheduling algorithms may be utilized for AMB chips 604 to return data frames to the memory controller 602, including variable-latency scheduling and fixed-latency scheduling. With respect to variable latency scheduling, after a read command is issued to the DRAM circuits 608, the DRAM circuits 608 return data to the AMB chip 604. The AMB chip 604 then constructs a data frame, and as soon as it can, places the data frame onto the northbound lanes to return the data to the memory controller 602. The variable latency scheduling algorithm may ensure the shortest latency for any given request in the FB-DIMM channel.

However, in the variable latency scheduling algorithm, DRAM circuits 608 located on the DIMM (e.g. the DIMM 606A, etc.) that is closest to the memory controller 602 may have the shortest access latency, while DRAM circuits 608 located on the DIMM (e.g. the DIMM 606C, etc.) that is at the end of the channel may have the longest access latency. As a result, the memory controller 602 may be sophisticated, such that command frames may be scheduled appropriately to ensure that data return frames do not collide on the northbound lanes.

In a FB-DIMM memory system 600 with only one or two DIMMs 606A-C, variable latency scheduling may be easily performed since there may be limited situations where data frames may collide on the northbound lanes. However, variable latency scheduling may be far more difficult if the memory controller 602 has to be designed to account for situations where the FB-DIMM channel can be configured with one DIMM, eight DIMMs, or any other number of DIMMs. Consequently, the fixed latency scheduling algorithm may be utilized in an FB-DIMM memory system 600 to simplify memory controller design.

In the fixed latency scheduling algorithm, every DIMM 606A-C is configured to provide equal access latency from the perspective of the memory controller 602. In such a case, the access latency of every DIMM 606A-C may be equalized to the access latency of the slowest-responding DIMM (e.g. the DIMM 606C, etc.). As a result, the AMB chips 604 that are not the slowest responding AMB chip 604 (e.g. the AMB chip 604 of the DIMM 606C, etc.) may be configured with additional delay before it can upload the data frames into the northbound lanes.

From the perspective of the AMB chips 604 that are not the slowest responding AMB chip 604 in the system, data access occurs as soon as the DRAM command is decoded and sent to the DRAM circuits 608. However, the AMB chips 604 may then hold the data for a number of cycles before this data is returned to the memory controller 602 via the northbound lanes. The data return delay may be different for each AMB chip 604 in the FB-DIMM channel.

Since the role of the data return delay is to equalize the memory access latency for each DIMM 606A-C, the data return delay value may depend on the distance of the DIMM 606A-C from the memory controller 602 as well as the access latency of the DRAM circuits 608 (e.g. the respective delay values may be computed for each AMB chip 604 in a given FB-DIMM channel, and programmed into the appropriate AMB chip 604.

In the context of the memory circuit power management scheme, the AMB chips 604 may use the programmed delay values to perform differing classes of memory circuit power management algorithms. In cases where the programmed data delay value is larger than k=n+x, where n is the minimum power down entry latency, x is the minimum power down exit latency, and k is the cumulative sum of the two, the AMB chip 604 can provide aggressive power management before and after every command. In particular, the large delay value ensures that the AMB chip 604 can place DRAM circuits 608 into power down modes and move them to active modes as needed.

In the cases where the programmed data delay value is smaller than k, but larger than x, the AMB chip 604 can place DRAM circuits 608 into power down modes selectively after certain commands, as long as these commands provide the required command operation periods to hide the minimum power down entry latency. For example, the AMB chip 604 can choose to place the DRAM circuits 608 into a power down mode after a refresh command, and the DRAM circuits 608 can be kept in the power down mode until a command is issued by the memory controller 602 to access the specific set of DRAM circuits 608. Finally, in cases where the programmed data delay is smaller than x, the AMB chip 604 may choose to implement power management algorithms to a selected subset of DRAM circuits 608.

There are various optional characteristics and benefits available when using CKE power management in FB-DIMMs. First, there is not necessarily a need for explicit CKE commands, and therefore there is not necessarily a need to use command bandwidth. Second, granularity is provided, such that CKE power management will power down DRAM circuits as needed in each DIMM. Third, the CKE power management can be most aggressive in the DIMM that is closest to the controller (e.g. the DIMM closest to the memory controller which contains the AMB chip that consumes the highest power because of the highest activity rates).

Other Embodiments

While many examples of power management schemes for memory circuits have been described above, other implementations are possible. For DDR2, for example, there may be approximately 15 different commands that could be used with a power management scheme. The above descriptions allow each command to be evaluated for suitability and then appropriate delays and timing may be calculated. For other memory circuit technologies, similar power saving schemes and classes of schemes may be derived from the above descriptions.

The schemes described are not limited to be used by themselves. For example, it is possible to use a trigger that is more complex than a single command in order to initiate power management. In particular, power management schemes may be initiated by the detection of combinations of commands, or patterns of commands, or by the detection of an absence of commands for a certain period of time, or by any other mechanism.

Power management schemes may also use multiple triggers including forming a class of power management schemes using multiple commands or multiple combinations of commands. Power management schemes may also be used in combination. Thus, for example, a row precharge time based power management scheme may be used in combination with a row activate time command based power management scheme.

The description of the power management schemes in the above sections has referred to an interface circuit in order to perform the act of signaling the DRAM circuits and for introducing delay if necessary. An interface circuit may optionally be a part of the stack of DRAM circuits. Of course, however, the interface circuit may also be separate from the stack of DRAM circuits. In addition, the interface circuit may be physically located anywhere in the stack of DRAM circuits, where such interface circuit electrically sits between the electronic system and the stack of DRAM circuits.

In one implementation, for example, the interface circuit may be split into several chips that in combination perform the power management functions described. Thus, for example, there may be a single register chip that electrically sits between the memory controller and a number of stacks of DRAM circuits. The register chip may optionally perform the signaling to the DRAM circuits.

The register chip may further be connected electrically to a number of interface circuits that sit electrically between the register chip and a stack of DRAM circuits. The interface circuits in the stacks of DRAM circuits may then perform the required delay if it is needed. In another implementation there may be no need for an interface circuit in each DRAM stack. In that case, the register chip can perform the signaling to the DRAM circuits directly. In yet another implementation, a plurality of register chips and buffer chips may sit electrically between the stacks of DRAM circuits and the system, where both the register chips and the buffer chips perform the signaling to the DRAM circuits as well as delaying the address, control, and data signals to the DRAM circuits. In another implementation there may be no need for a stack of DRAM circuits. Thus each stack may be a single memory circuit.

Further, the power management schemes described for the DRAM circuits may also be extended to the interface circuits. For example, the interface circuits have information that a signal, bus, or other connection will not be used for a period of time. During this period of time, the interface circuits may perform power management on themselves, on other interface circuits, or cooperatively. Such power management may, for example, use an intelligent signaling mechanism (e.g. encoded signals, sideband signals, etc.) between interface circuits (e.g. register chips, buffer chips, AMB chips, etc.).

It should thus be clear that the power management schemes described here are by way of specific examples for a particular technology, but that the methods and techniques are very general and may be applied to any memory circuit technology to achieve control over power behavior including, for example, the realization of power consumption savings and management of current consumption behavior.

Dram Circuit Configuration Verification Embodiments

In the various embodiments described above, it may be desirable to verify that the simulated DRAM circuit including any power management scheme or CAS latency simulation or any other simulation behaves according to a desired DRAM standard or other design specification. A behavior of many DRAM circuits is specified by the JEDEC standards and it may be desirable, in some embodiments, to exactly simulate a particular JEDEC standard DRAM. The JEDEC standard may define control signals that a DRAM circuit must accept and the behavior of the DRAM circuit as a result of such control signals. For example, the JEDEC specification for a DDR2 SDRAM may include JESD79-2B (and any associated revisions).

If it is desired, for example, to determine whether a JEDEC standard is met, an algorithm may be used. Such algorithm may check, using a set of software verification tools for formal verification of logic, that protocol behavior of the simulated DRAM circuit is the same as a desired standard or other design specification. This formal verification may be feasible because the DRAM protocol described in a DRAM standard may, in various embodiments, be limited to a few protocol commands (e.g. approximately 15 protocol commands in the case of the JEDEC DDR2 specification, for example).

Examples of the aforementioned software verification tools include MAGELLAN supplied by SYNOPSYS, or other software verification tools, such as INCISIVE supplied by CADENCE, verification tools supplied by JASPER, VERIX supplied by REAL INTENT, 0-IN supplied by MENTOR CORPORATION, etc. These software verification tools may use written assertions that correspond to the rules established by the DRAM protocol and specification.

The written assertions may be further included in code that forms the logic description for the interface circuit. By writing assertions that correspond to the desired behavior of the simulated DRAM circuit, a proof may be constructed that determines whether the desired design requirements are met. In this way, one may test various embodiments for compliance with a standard, multiple standards, or other design specification.

For example, assertions may be written that there are no conflicts on the address bus, command bus or between any clock, control, enable, reset or other signals necessary to operate or associated with the interface circuits and/or DRAM circuits. Although one may know which of the various interface circuit and DRAM stack configurations and address mappings that have been described herein are suitable, the aforementioned algorithm may allow a designer to prove that the simulated DRAM circuit exactly meets the required standard or other design specification. If, for example, an address mapping that uses a common bus for data and a common bus for address results in a control and clock bus that does not meet a required specification, alternative designs for the interface circuit with other bus arrangements or alternative designs for the interconnect between the components of the interface circuit may be used and tested for compliance with the desired standard or other design specification.

While various embodiments have been described above, it should be understood that they have been presented by way of example only, and not limitation. For example, any of the elements may employ any of the desired functionality set forth hereinabove. Thus, the breadth and scope of a preferred embodiment should not be limited by any of the above-described exemplary embodiments, but should be defined only in accordance with the following claims and their equivalents.

What is claimed is:

1. A sub-system, comprising:
an interface circuit in communication with a plurality of memory circuits and a system, the interface circuit operable to perform a power management operation in association with only a portion of the memory circuits;
wherein the interface circuit is operable to simulate at least one virtual memory circuit.

2. The sub-system of claim 1, wherein the power management operation includes a power saving operation.

3. The sub-system of claim 2, wherein the power saving operation includes a power down operation.

4. The sub-system of claim 1, wherein the power management operation is initiated by at least one power management signal.

5. The sub-system of claim 4, wherein the at least one power management signal includes at least one of a clock enable signal, and a chip select signal.

6. The sub-system of claim 1, wherein the power management operation is initiated by at least one non-power management signal.

7. The sub-system of claim 1, wherein the power management operation is initiated based on a state of one or more of the memory circuits.

8. The sub-system of claim 7, wherein the state is selected from the group consisting of a status of the one or more of the memory circuits, a predetermined combination of commands issued to the one or more of the memory circuits, a predetermined pattern of commands issued to the one or more of the memory circuits, and a predetermined absence of commands issued to the one or more of the memory circuits.

9. The sub-system of claim 1, wherein the power management operation is performed in association with only a portion of the at least one virtual memory circuit.

10. The sub-system of claim 1, wherein the at least one virtual memory circuit includes a single virtual memory circuit.

11. The sub-system of claim 1, wherein the power management operation includes powering down a first portion of the memory circuits while a second portion of the memory circuits is subject to at least one command.

12. The sub-system of claim 1, wherein the interface circuit includes a circuit that is positioned on a dual in-line memory module (DIMM).

13. The sub-system of claim 1, wherein the interface circuit is selected from the group consisting of a buffer, a register, a memory controller, and an advanced memory buffer (AMB).

14. The sub-system of claim 1, wherein the interface circuit and the memory circuits take the form of a stack.

15. The sub-system of claim 14, wherein the stack includes a single interface circuit.

16. The sub-system of claim 1, wherein the interface circuit includes a single register.

17. The sub-system of claim 14, wherein the stack includes a plurality of interface circuits.

18. A method, comprising:
   interfacing a plurality of physical memory circuits and a system;
   simulating at least one virtual memory circuit; and
   performing a power management operation in association with only a portion of the at least one virtual memory circuit.

19. A system, comprising:
   a plurality of physical memory circuits; and
   an interface circuit in communication with the physical memory circuits and a system, the interface circuit operable to interface the physical memory circuits and the system for simulating at least one virtual memory circuit and performing a power management operation in association with only a portion of the at least one virtual memory circuit.

* * * * *